(12) United States Patent
Yoon et al.

(10) Patent No.: US 12,457,814 B2
(45) Date of Patent: Oct. 28, 2025

(54) IMAGE SENSING DEVICE

(71) Applicant: SK hynix Inc., Icheon-si (KR)

(72) Inventors: Hyung June Yoon, Icheon-si (KR); Ho Young Kwak, Icheon-si (KR); Nam Il Kim, Icheon-si (KR); Dong Jin Lee, Icheon-si (KR); Jae Won Lee, Icheon-si (KR); Hoon Moo Choi, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 737 days.

(21) Appl. No.: 17/829,541

(22) Filed: Jun. 1, 2022

(65) Prior Publication Data
US 2022/0415942 A1 Dec. 29, 2022

(30) Foreign Application Priority Data

Jun. 25, 2021 (KR) .................. 10-2021-0083365

(51) Int. Cl.
*H10F 39/00* (2025.01)
(52) U.S. Cl.
CPC ....... *H10F 39/8037* (2025.01); *H10F 39/802* (2025.01)

(58) Field of Classification Search
CPC .. H10F 39/8037; H10F 39/802; H10F 39/807; H10F 39/811; G01S 17/46; H04N 25/705; H04N 25/76
See application file for complete search history.

(56) References Cited

U.S. PATENT DOCUMENTS

| 10,886,312 B2 | 1/2021 | Na et al. | |
| 2018/0076259 A1* | 3/2018 | Park | H10F 77/14 |
| 2018/0188356 A1* | 7/2018 | Na | G01S 17/10 |
| 2020/0028017 A1 | 1/2020 | Imoto et al. | |

* cited by examiner

*Primary Examiner* — Syed I Gheyas
(74) *Attorney, Agent, or Firm* — Perkins Coie LLP

(57) ABSTRACT

An image sensing device is provided to include: a substrate having a first surface on which light is incident and a second surface facing the first surface; a plurality of detection structures, each comprising a control node configured to exhibit a conductivity type and generate a potential gradient in the substrate, and a detection node configured to capture photocharge which is generated in response to incident light and migrates in response to the potential gradient; and a first well area disposed to abut the control nodes of the plurality of detection structures and containing an impurity with a different conductivity type from the conductivity type of the control nodes.

19 Claims, 9 Drawing Sheets

|  :TA1 |  :WBA1 |  :CPC |
| --- | --- | --- |
|  :TB2 |  :WBA2 |  :PTA |
|  :TB3 |  :WBA3 |  :VS |
|  :TA4 |  :WBA4 |  :HC1 |

IMAGE SENSING DEVICE

CROSS-REFERENCES TO RELATED APPLICATION

The present application claims priority under 35 U.S.C. § 119(a) to Korean application number 10-2021-0083365, filed on Jun. 25, 2021, in the Korean Intellectual Property Office, which is incorporated herein by reference in its entirety.

TECHNICAL FIELD

Various embodiments generally relate to an image sensing device for sensing the distance to a target object.

BACKGROUND

An image sensing device refers to a device for capturing optical images by converting light into electrical signals using a photosensitive semiconductor material which reacts to light. With the development of automotive, medical, computer and communication industries, the demand for high-performance image sensing devices is increasing in various fields such as smart phones, digital cameras, game machines, IOT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

Various embodiments are directed to an image sensing device including ToF pixels capable of reducing unnecessary power consumption.

The technical problems of the present disclosure are not limited to the above-mentioned technical problems, and other technical problems which are not mentioned herein will be clearly understood by those skilled in the art from the following descriptions.

In some implementations, an image sensing device is provided to include: a substrate comprising a back side on which light is incident and a front side facing the back side; a plurality of taps each comprising a control node configured to generate a potential gradient in the substrate, and a detection node configured to capture photocharge which is generated by the light and migrated by the potential gradient; and a first well area disposed to abut on the control nodes of the taps, and containing an impurity with a different conductive type from the control nodes.

In some implementations, an image sensing device is provided to include: a substrate having a first surface on which light is incident and a second surface facing the first surface; a plurality of detection structures, each comprising a control node configured to exhibit a conductivity type and generate a potential gradient in the substrate, and a detection node configured to capture photocharge which is generated in response to incident light and migrates in response to the potential gradient; and a first well area disposed to abut the control nodes of the plurality of detection structures and containing an impurity with a different conductivity type from the conductivity type of the control nodes.

In some implementations, an image sensing device is provided to include: a plurality of taps each configured to generate a potential gradient in a substrate, and capture photocharge which is generated by incident light and migrated by the potential gradient; a first well area disposed to abut on the taps; a pixel transistor area comprising pixel transistors each configured to convert the captured photocharge into a pixel signal; an STI area comprising a trench disposed between the pixel transistor area and each of the taps; and one or more well bunker areas disposed in the STI area and not comprising the trench.

In some implementations, an image sensing device is provided to detection structures disposed in a pixel and configured to generate a potential gradient in a substrate and capture photocharges which are generated by incident light and migrated by the potential gradient; a first well area disposed to abut on the detection structures and including an impurity with a first conductivity type; a pixel transistor area disposed along an edge of the pixel and comprising pixel transistors, the pixel transistors configured to convert the captured photocharge into a pixel signal; an STI area comprising a trench disposed between the pixel transistor area and each of the detection structures; and one or more well bunker areas disposed in the STI area without having the trench.

In accordance with the present embodiments, the image sensing device can improve the performance of a ToF pixel while reducing the power consumption of the ToF pixel.

In addition, it is possible to provide various effects which are directly or indirectly understood through this document.

DETAILED DESCRIPTION

Hereafter, various embodiments of the present disclosure will be described with reference to the accompanying drawings.

The demand for a method for measuring a depth using an image sensor is rapidly increasing in various fields such as a security device, medical device, vehicle, game machine, VR/AR and mobile device. Representative examples of the method for measuring a depth may include triangulation, ToF (Time of Flight) and interferometry. Among the methods, the ToF method can be utilized in a wide range, has high processing speed, and can be implemented at low cost. Thus, the importance of the ToF method is rising.

The ToF method may be roughly divided into a direct method for measuring a distance by directly calculating a round trip time and an indirect method for measuring a distance using a phase difference, based on the common principle to measure a distance using emitted light and reflected and returning light. Since the direct method is suitable for a long distance, the direct method is often used in a vehicle and the like. The indirect method suitable for a short distance is used for a game machine or mobile camera which requires high processing speed. The indirect method requires a simple circuit configuration and less memories, and can be implemented at relatively low cost.

A CAPD (Current-Assisted Photonic Demodulator) pixel, which is one of pixels operated through the indirect ToF method, applies a substrate voltage and detects electrons, which are generated in a pixel, using a majority current on the basis of a potential difference of an electric field. Since the CAPD uses the majority current, the CAPD pixel can rapidly detect electrons. Furthermore, since the CAPD pixel can detect even electrons which are formed deeply from a light incident surface, the CAPD pixel may be considered to have excellent efficiency.

Figure 1:
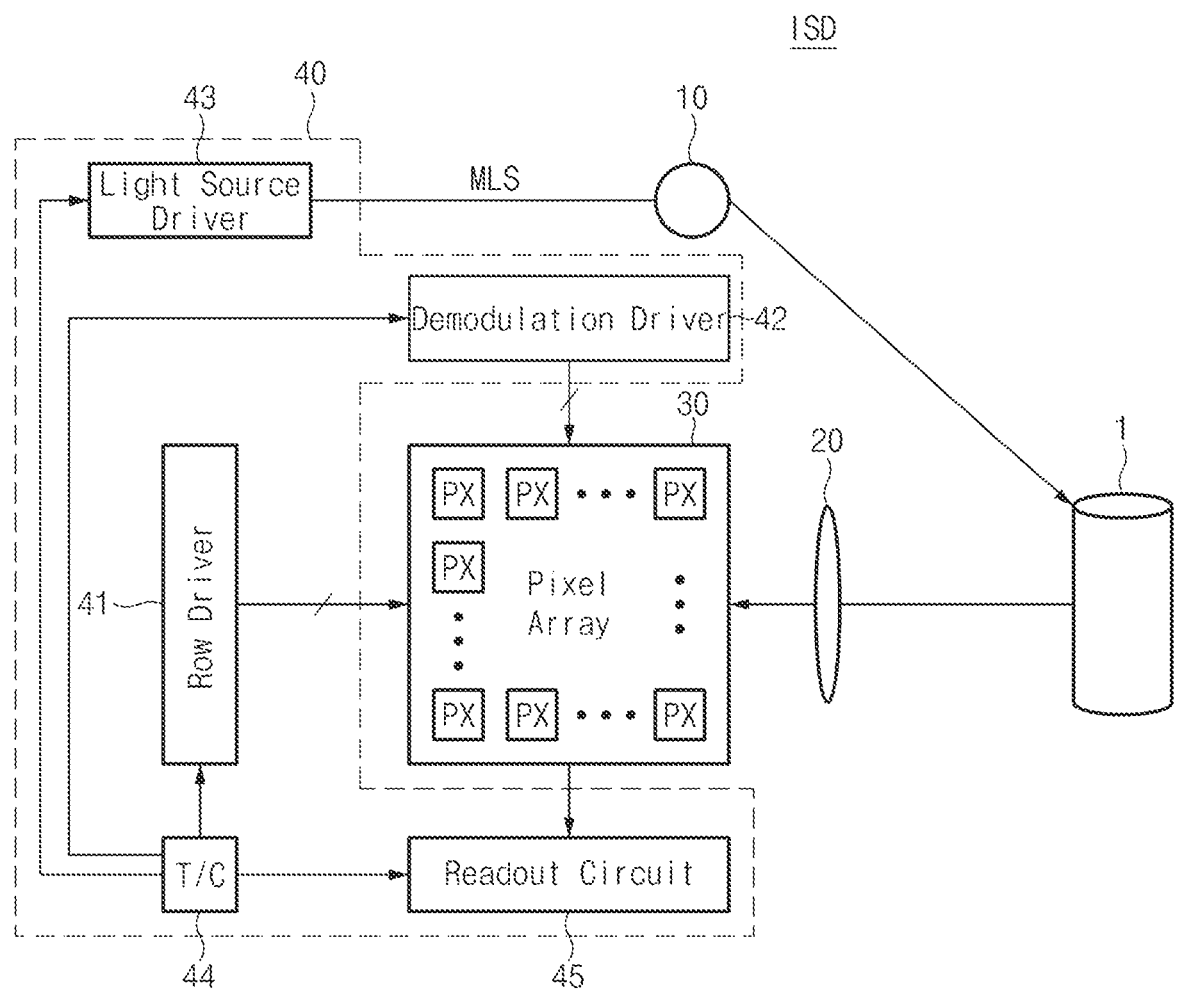
FIG. 1 is a configuration diagram schematically illustrating a configuration of an image sensing device in accordance with an embodiment.

FIG. 1 is a configuration diagram schematically illustrating a configuration of an image sensing device in accordance with embodiments.

Referring to FIG. 1, an image sensing device ISD may measure the distance to a target object 1 using a ToF method. The ToF method may be divided into a direct ToF method and an indirect ToF method. The direct ToF method may indicate a method that measures the distance to the target object 1 by emitting light toward the target object 1 and measuring the time of flight (ToF) that the light travels from a light source of the ISD to the target object 1 and back to the ISD as the reflected light from the target object arrives at the ISD where the distance is the light of speed multiplied by one half of the ToF. The indirect ToF method may indicate a method that emits modulated light toward the target object 1, senses light reflected and incident from the target object 1, and indirectly measures the distance between the image sensing device ISD and the target object 1 on the basis of the phase difference between the modulated light and the reflected light. In the present embodiment, the case in which the image sensing device ISD uses the indirect ToF method will be taken as an example of description. However, the scope of the present embodiment is not limited thereto. Furthermore, the target object 1 does not indicate only one independent object, but may indicate a scene which is captured by the image sensing device ISD.

The image sensing device ISD may include a light source 10, a lens module 20, a pixel array 30 and a control block 40.

The light source 10 emits light onto the target object 1 in response to a light modulation signal MLS provided from the control block 40. Examples of the light source 10 may include an LD (Laser Diode) or LED (Light Emitting Diode), an NIR (Near Infrared Laser), a point light source, a monochromatic illumination source and a combination of other laser sources. The LD or the LED emits a specific wavelength band of light (for example, near-infrared ray, infrared ray or visible light), and the monochromatic illumination source is configured by combining a white lamp and a monochromator. For example, the light source 10 may emit infrared light having a wavelength of 800 nm to 1,000 nm. The light emitted from the light source 10 may be light modulated at a predetermined frequency. FIG. 1 illustrates only one light source 10 for convenience of description, but a plurality of light sources may be arranged around the lens module 20.

The lens module 20 may collect light reflected from the target object 1, and focus the collected light on pixels PX of the pixel array 30. For example, the lens module 20 may include a focusing lens having a glass or plastic surface or a cylindrical optical element. The lens module 20 may include a plurality of lenses aligned with an optical axis.

The pixel array 30 may include a plurality of unit pixels PX which are successively arranged in a 2D matrix, for example, a plurality of unit pixels PX which are successively arranged in column and row directions. The unit pixels PX may be formed in a semiconductor substrate, and each of the unit pixels PX may convert light, incident through the lens module 20, into an electrical signal corresponding to the intensity of the light, and output the electrical signal as a pixel signal. At this time, the pixel signal may be a signal indicating the distance to the target object 1. For example, each of the unit pixels PX may be a CAPD (Current-Assisted Photonic Demodulator) pixel or QEM (Quantum Efficiency Modulation) pixel. In the present embodiment, the CAPD pixel will be taken as an example for description. However, substantially the same technical idea as the present embodiment may be applied to the QEM pixel or other types of pixels. The more detailed structure and operation of the unit pixel PX will be described below with reference to FIG. 2 and the followings.

The control block 40 may control the light source 10 to emit light onto the target object 1, and drive the unit pixels PX of the pixel array 30 to process pixel signals corresponding to the light reflected from the target object 1, thereby measuring the distance to the surface of the target object 1.

Such a control block 40 may include a row driver 41, a demodulation driver 42, a light source driver 43, a timing controller (T/C) 44 and a readout circuit 45.

The row driver 41 and the demodulation driver 42 may be collectively referred to as a control circuit.

The control circuit may drive the unit pixels PX of the pixel array 30 in response to a timing signal outputted from the timing controller 44.

The control circuit may generate a control signal capable of selecting and controlling one or more row lines among a plurality of row lines of the pixel array 30. Such a control signal may include a demodulation control signal for generating a pixel current within a substrate, a reset signal for controlling a reset transistor, a transmission signal for controlling transfer of photocharge that is generated in responding to incident light and accumulated in a detection node, a floating diffusion signal for providing an additional capacitance under a high luminance condition, and a selection signal for controlling a selection transistor. The pixel current may indicate or correlate to a current associated with migrating photocharge, generated in the substrate, toward the detection node.

The row driver 41 may generate the reset signal, the transmission signal, the floating diffusion signal and the selection signal, and the demodulation driver 42 may generate the demodulation control signal. In the present embodiment, the row driver 41 and the demodulation driver 42 are configured as independent circuit components. In another embodiment, however, the row driver 41 and the demodulation driver 42 may be configured as one circuit component and disposed on one side of the pixel array 30.

The light source driver 43 may generate the light modulation signal MLS capable of driving the light source 10, under control of the timing controller 44. The light modulation signal MLS may be a signal modulated at a predetermined frequency so that the output light from the light source 10 is modulated at this predetermined frequency.

The timing controller 44 may generate a timing signal for controlling the operations of the row driver 41, the demodulation driver 42, the light source driver 43 and the readout circuit 45.

The readout circuit 45 may generate pixel data in the form of digital signals by processing pixel signals outputted from the pixel array 30, under control of the timing controller 44. For this operation, the readout circuit 45 may include a CDS (Correlated Double Sampler) for performing correlated double sampling on the pixel signals outputted from the pixel array 30. The readout circuit 45 may include an analog-digital converter for converting output signals from the CDS into digital signals. Furthermore, the readout circuit 45 may include a buffer circuit which temporarily stores pixel data outputted from the analog-digital converter and outputs the pixel data to the outside under control of the timing controller 44. As the pixel array 30 is composed of CAPD pixels, each column of the pixel array 30 may include two column lines for transferring pixel signals, and components for processing pixel signals outputted from the column lines may also be provided for the respective column lines.

The light source 10 may emit light, modulated at a predetermined frequency, toward a scene captured by the image sensing device ISD, and the image sensing device ISD may sense modulated light (i.e. incident light) reflected from target objects 1 within the scene, and generate depth information on each of the unit pixels PX. The modulated light and the incident light have a time delay present therebetween, depending on the distance between the image sensing device ISD and the target object 1. Such a time delay appears as a phase difference between a signal generated by the image sensing device ISD and the light modulation signal MLS for controlling the light source 10. The image processor (not illustrated) may generate a depth image containing depth information on each of the unit pixels PX by calculating a phase difference which appears in a signal outputted from the image sensing device ISD.

Figure 2:
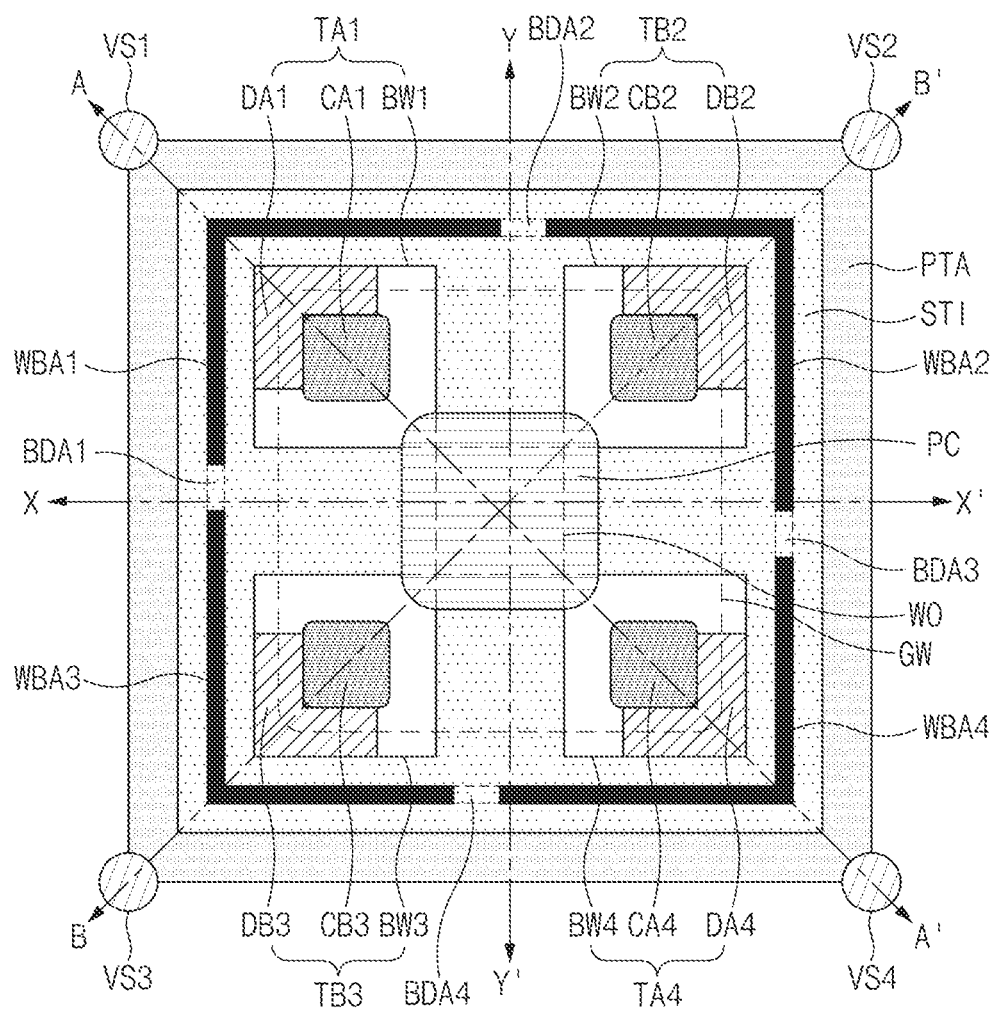
FIG. 2 is a diagram briefly illustrating an example of the layout of a pixel illustrated in FIG. 1.

FIG. 2 is a diagram illustrating an example of the layout of a pixel illustrated in FIG. 1.

Referring to FIG. 2, a pixel 200 may be any one of the pixels PX illustrated in FIG. 1. While FIG. 2 shows a schematic diagram of a single pixel 200, the same or similar structures and the operation can be applied to any pixel included in the pixel array 30.

The pixel 200 may include a first tap TA1, a second tap TB2, a third tap TB3, a fourth tap TA4, a guide well area GW, a potential control area PC, a pixel transistor area PTA, first to fourth voltage stabilization areas VS1 to VS4, an STI (Shallow Trench Isolation) area STI, and first to fourth well bunker areas WBA1 to WBA4. In the present embodiment, the case in which one pixel 200 includes four taps TA1, TB2, TB3 and TA4 is taken as an example for description. However, the number of taps included in the pixel 200 is not limited to four and other implementations are also possible. Thus, one pixel 200 may include three or less taps or five or more taps. In this case, the plurality of taps may receive the same or different types of demodulation control signals. The different types of demodulation control signals may indicate the demodulation control signals received at different timings.

The first tap TA1 and the fourth tap TA4 may be defined as a first tap group which receives the same demodulation control signals, and the second tap TB2 and the third tap TB3 may be defined as a second tap group which receives the same demodulation control signals. The first tap group and the second tap group may receive different demodulation control signals. The demodulation control signal received by the first tap group may be defined as a first demodulation control signal, and the demodulation control signal received by the second tap group may be defined as a second demodulation control signal.

The first tap TA1 and the fourth tap TA4 may be disposed on both sides of the center of the pixel 200 in a first diagonal direction, and the second tap TB2 and the third tap TB3 may be disposed on both sides of the center of the pixel 200 in a second diagonal direction. The first diagonal direction may indicate the direction of a straight line A-A' passing through a first vertex positioned at the left top of the pixel 200 and a fourth vertex positioned at the right bottom of the pixel 200, and the second diagonal direction may indicate the direction of a straight line B-B' passing through a second vertex positioned at the right top of the pixel 200 and a third vertex positioned at the left bottom of the pixel 200. Therefore, the first tap TA1 and the fourth tap TA4 may be disposed to face each other in the first diagonal direction with respect to the center of the pixel 200, and the second tap TB2 and the third tap TB3 may be disposed to face each other in the second diagonal direction with respect to the center of the pixel.

The first tap TA1 may include a first control node CA1, a first detection node DA1 and a first bottom well area BW1.

FIG. 2 illustrates that the first control node CA1 has a rectangular shape, and the first detection node DA1 surrounds the top and left sides of the first control node CA1, but the scope of the present embodiment is not limited thereto. In the example as shown in FIG. 2, the first detection node DA1 surrounds the first control node CA1 across a larger area, which makes the first detection node DA1 more easily capture signal carriers which migrate along a potential gradient formed by the first control node CA1. The potential described in the present disclosure may indicate an electrical potential.

The first bottom well area BW1 may be disposed to overlap the first control node CA1 and the first detection node DA1, and have a larger area than the first control node CA1. The first bottom well area BW1 may be vertically spaced apart from the first control node CA1 and the first detection node DA1, and the guide well area GW may be disposed between the first control node CA1 and the first detection node DA1 and the first bottom well area BW1.

In one implementation, the first control node CA1 and the first detection node DA1 may be disposed to abut on each other, and physically isolated from each other by junction isolation through counter doping.

According to another embodiment, the first control node CA1 and the first detection node DA1 may be spaced, by a predetermined distance, apart from each other, and an insulating material may be disposed between the first control node CA1 and the first detection node DA1.

The second tap TB2 may include a second control node CB2, a second detection node DB2 and a second bottom well area BW2.

FIG. 2 illustrates that the second control node CB2 has a rectangular shape, and the second detection node DB2 surrounds the top and right sides of the second control node CB2, but the scope of the present disclosure is not limited thereto. In the example as shown in FIG. 2, the second detection node DB2 surrounds the second control node CB2 across a larger area, which makes the second detection node DB2 more easily capture signal carriers which migrate according to a potential gradient formed by the second control node CB2.

The second bottom well area BW2 may be disposed to overlap the second control node CB2 and the second detection node DB2, and have a larger area than the second control node CB2. The second bottom well area BW2 may be vertically spaced apart from the second control node CB2 and the second detection node DB2, and the guide well area GW may be disposed between the second control node CB2 and the second detection node DB2 and the second bottom well area BW2.

The arrangement shapes and structures of the second control node CB2, the second detection node DB2 and the second bottom well area BW2 may correspond to those of the first control node CA1, the first detection node DA1 and the first bottom well area BW1. Therefore, the overlapping descriptions thereof will be omitted herein.

The arrangement shape and structure of the third tap TB3 are substantially the same as those of the second tap TB2 except that the third tap TB3 is disposed at a different position from the second tap TB2, and a third detection node DB3 surrounds the bottom and left sides of a third control node CB3. Thus, the overlapping descriptions thereof will be omitted herein.

The arrangement shape and structure of the fourth tap TA4 are substantially the same as those of the first tap TA1 except that the fourth tap TA4 is disposed at a different position from the first tap TA1, and a fourth detection node DA4 surrounds the bottom and right sides of a fourth control node CA4. Thus, the overlapping descriptions thereof will be omitted herein.

The guide well area GW may be disposed to overlap at least a part of each of the first to fourth detection nodes DA1, DB2, DB3 and DA4 and at least a part of each of the first to fourth bottom well areas BW1 to BW4, while surrounding the first to fourth control nodes CA1, CB2, CB3 and CA4. The guide well area GW may be doped with an impurity having a different conductivity type from the conductivity type of the first to fourth control nodes CA1, CB2, CB3 and CA4, and electrically floated.

The guide well area GW may include a depletion area which is formed by a PN junction, as the guide well area GW is disposed to abut on each of the first to fourth control nodes CA1, CB2, CB3 and CA4 and each of the first to fourth bottom well areas BW1 to BW4. The potential of the depletion area adjacent to each of the first to fourth control nodes CA1, CB2, CB3 and CA4 may be controlled according to a voltage applied to each of the first to fourth control nodes CA1, CB2, CB3 and CA4, i.e. the first or second demodulation control signal. For example, it is assumed that an active voltage is applied to the first and fourth control nodes CA1 and CA4, and an inactive voltage is applied to the second and third control nodes CB2 and CB3. At this time, the depletion area adjacent to each of the first and fourth control nodes CA1 and CA4 has a potential that momentarily rises to retain the PN junction, and the depletion area adjacent to each of the second and third control nodes CB2 and CB3 has a relatively low potential. Therefore, photocharge generated in the substrate in response to incident light may be migrated through the depletion areas adjacent to the first and fourth control nodes CA1 and CA4 having a high potential, and captured by the first and fourth detection nodes DA1 and DA4.

Thus, the guide well area GW may provide a potential gradient such that the photocharge generated in the substrate in response to incident light can migrate to the corresponding detection nodes. In accordance with the present embodiment, a separate current (for example, a hole current) dose not need to be generated in order to migrate signal carriers. The potentials of the depletion areas can be momentarily controlled to perform the demodulation operation at a high speed without wasting of power in providing separate current to move signal carriers. Thus, the present embodiment allows an optical modulation which captures photocharge generated from modulated light by adjusting the potential of the floated guide well area GW. In some implementations, the optical modulation may be understood as the well-based optical modulation since the photocharge is captured by using the well region abutting on the taps without using the separate current such as the hole current.

Since the inside of the guide well area GW is mostly filled with the depletion areas due to the PN junction with the taps TA1, TB2, TB3 and TA4, a hole current hardly flows between an activated tap and an inactivated tap inside the guide well area GW due to the characteristic of the depletion areas in which carriers (i.e. holes and electrons) are not present. In the present embodiment, it is assumed that no hole current (or almost zero hole current) flows between an activated tap and an inactivated tap.

The guide well area GW may include a well opening WO which does not overlap the first to fourth bottom well areas BW1 to BW4. The well opening WO in which the first to fourth bottom well areas BW1 to BW4 are not disposed may correspond to a path through which photocharges within the substrate are introduced into the guide well area GW.

The well opening WO may be disposed to overlap the potential control area PC, and the potential of the guide well area GW corresponding to the well opening WO may be controlled according to a voltage applied to the potential control area PC. The potential control area PC may be disposed in the center of the pixel 200 or the center of the first to fourth taps TA1, TB2, TB3 and TA4.

The potential of the potential control area PC may be controlled by a potential control voltage which is generated by the row driver 41 or the demodulation driver 42. The potential control voltage may have an absolute value which is smaller than that of the active voltage of the first and second demodulation control signals and larger than that of the inactive voltage thereof. When it is assumed that the active voltage and the inactive voltage have the same polarity, the potential control voltage may have the opposite polarity to those of the active voltage and the inactive voltage. According to an embodiment, the potential control voltage may have an absolute value corresponding to the average voltage (for example, 0.6 V) of the active voltage and the inactive voltage. In order to reduce unnecessary power consumption, the potential control area PC may receive the potential control voltage only in a period where the pixel 200 is operated.

As the potential control voltage is applied to the potential control area PC, the potential control area PC may form a potential gradient such that the photocharges can easily migrate toward the first to fourth taps TA1, TB2, TB3 and TA4. For example, when the active voltage is applied to the first and fourth taps TA1 and TA4 and the inactive voltage is applied to the second and third taps TB2 and TB3, the guide well area GW adjacent to the first and fourth taps TA1 and TA4 may have the highest potential, the guide well area GW adjacent to the second and third taps TB2 and TB3 has the lowest potential, and the guide well area GW corresponding to the well opening WO has a medium potential. Thus, the photocharges generated in the substrate are introduced into the well opening WO and can be captured after easily being migrated to the first and fourth taps TA1 and TA4 by the potential gradient formed by the potential control area PC.

The pixel transistor area PTA may be disposed in a shape to surround the area in which the first to fourth taps TA1, TB2, TB3 and TA4 are disposed. The pixel transistor area PTA may include pixel transistors (TX1, RX1, BX1, SF1 and SX1 of FIG. 3) for processing photocharges captured by the first and fourth taps TA1 and TA4 corresponding to the first tap group and pixel transistors (TX2, RX2, BX2, SF2 and SX2 of FIG. 3) for processing photocharges captured by the second and third taps TB2 and TB3 corresponding to the second tap group. According to an embodiment, the pixel transistors included in the pixel transistor area PTA may be disposed in a line along the boundary between pixels adjacent to each other. However, the scope of the present disclosure is not limited thereto.

The first to fourth voltage stabilization areas VS1 to VS4 may be disposed at first to fourth vertices of the pixel 200, respectively.

Each of the transistors included in the pixel transistor area PTA may include a gate configured as a gate electrode which is disposed on a dielectric layer formed on one surface of a substrate, a source and drain configured as impurity areas which are disposed on both sides of the gate electrode in the substrate, and a channel area corresponding to a lower area of the gate electrode in the substrate. The source and drain may be surrounded by a P-well doped with a P-type impurity at a predetermined concentration, and the P-well may be extended and disposed even in the lower area of the gate electrode. The P-well may also be extended to the bottoms of the first to fourth voltage stabilization areas VS1 to VS4, and surround the first to fourth voltage stabilization areas VS1 to VS4 while abutting on the first to fourth voltage stabilization areas VS1 to VS4. In other words, the P-well surrounding the voltage stabilization areas may be extended up to the bottoms of the pixel transistors adjacent to each other.

The first to fourth voltage stabilization areas VS1 to VS4 may be P+ impurity areas doped at a higher concentration than the P-well in the substrate.

The first to fourth voltage stabilization areas VS1 to VS4 may receive a specific voltage (for example, ground voltage), and clamp the voltage of the P-well, abutting on the first to fourth voltage stabilization areas VS1 to VS4, to the specific voltage. The specific voltage may indicate the inactive voltage (or ground voltage). The P-well may be disposed under the pixel transistor area PTA and form the body of each pixel transistor, and the voltage of the P-well may have an influence on the threshold voltage of each pixel transistor. The first to fourth voltage stabilization areas VS1 to VS4 may supply the body voltages of the pixel transistors, thereby guaranteeing stable operations of the pixel transistors included in the pixel transistor area PTA.

The voltage stabilization areas included in the pixel array 30 may be electrically coupled to each other in a mesh shape. Such a coupling may prevent a phenomenon in which a ground voltage is not normally supplied to a specific voltage stabilization area, due to an IR drop of a signal line for supplying the ground voltage.

The STI area STI may be disposed in a shape to surround the area where the first to fourth taps TA1, TB2, TB3 and TA4 are disposed, and surrounded by the pixel transistor area PTA. That is, the STI area STI may be disposed between the pixel transistor area PTA and the area where the first to fourth taps TA1, TB2, TB3 and TA4 are disposed, in order to isolate the two areas from each other.

The STI area STI may include a dielectric layer formed by gap-filling a trench (or STI structure) with a dielectric material, the trench being formed by an STI process. For example, the dielectric material may include one or more of silicon oxynitride ($Si_xO_yN_z$), silicon oxide ($Si_xO_y$) and silicon nitride ($Si_xN_y$) where x, y and z are natural numbers. The trench of the STI area STI may be formed by etching the substrate such that the trench has a predetermined depth from one surface (e.g. front surface) of the substrate.

The first to fourth well bunker areas WBA1 to WBA4 may each have an L-shape. The first to fourth well bunker areas WBA1 to WBA4 may be disposed in the STI area STI, extended along the corresponding sides of the STI area STI, and disposed at the respective corners which the STI area STI crosses the first or second diagonal direction. In other words, the first to fourth well bunker areas WBA1 to WBA4 may be disposed between the first to fourth voltage stabilization areas VS1 to VS4 and the first to fourth taps TA1, TB2, TB3 and TA4, respectively.

Each of the first to fourth well bunker areas WBA1 to WBA4 may be the area from which the STI process for forming the STI area STI is excluded (or omitted). Thus, each of the first to fourth well bunker areas WBA1 to WBA4 may include no trench (or STI structure) or dielectric layer. Therefore, the STI areas STI adjacent to the top and bottom or left and right of each of the first to fourth well bunker areas WBA1 to WBA4 may be isolated (disconnected) by the corresponding well bunker area.

Between two well bunker areas adjacent to each other, among the first to fourth well bunker areas WBA1 to WBA4, a bunker disconnection area may be disposed. Thus, a first bunker disconnection area BDA1 may be disposed between the first and fourth well bunker areas WBA1 and WBA4, a second bunker disconnection area BDA2 may be disposed between the first and second well bunker areas WBA1 and WBA2, a third bunker disconnection area BDA3 may be disposed between the second and third well bunker areas WBA2 and WBA3, and a fourth bunker disconnection area BDA4 may be disposed between the third and fourth well bunker areas WBA3 and WBA4.

Each of the first to fourth bunker disconnection areas BDA1 to BDA4, corresponding to a portion of the STI area STI, may include a trench (or STI structure) and a dielectric layer, like the STI area STI. Each of the first to fourth bunker disconnection areas BDA1 to BDA4 may be disposed to disconnect the adjacent well bunker areas from each other.

Points at which the first to fourth well bunker areas WBA1 to WBA4 are bent are defined as first to fourth bending points, respectively. The length of the first well bunker area WBA1 extended from the first bending point of the first well bunker area WBA1 in a first direction (horizontal direction or row direction) may be larger than the length of the first well bunker area WBA1 extended from the first bending point in a second direction (vertical direction or column direction). The length of the second well bunker area WBA2 extended from the second bending point of the second well bunker area WBA2 in the second direction may be larger than the length of the second well bunker area WBA2 extended from the second bending point in the first direction. The length of the third well bunker area WBA3 extended from the third bending point of the third well bunker area WBA3 in the first direction may be larger than the length of the third well bunker area WBA3 extended from the third bending point in the second direction. The length of the fourth well bunker area WBA4 extended from the fourth bending point of the fourth well bunker area WBA4 in the second direction may be larger than the length of the fourth well bunker area WBA4 extended from the fourth bending point in the first direction.

In some implementations, the first well bunker area WBA1 and the first bunker disconnection area BDA1 may be rotated by 90 degrees in the clockwise direction around the pixel 200, and overlap the second well bunker area WBA2 and the second bunker disconnection area BDA2, respectively. The second well bunker area WBA2 and the second bunker disconnection area BDA2 may be rotated by 90 degrees in the clockwise direction around the pixel 200, and overlap the third well bunker area WBA3 and the third bunker disconnection area BDA3, respectively. The third well bunker area WBA3 and the third bunker disconnection area BDA3 may be rotated by 90 degrees in the clockwise direction around the pixel 200, and overlap the fourth well bunker area WBA4 and the fourth bunker disconnection area BDA4, respectively. The fourth well bunker area WBA4 and the fourth bunker disconnection area BDA4 may be rotated by 90 degrees in the clockwise direction around the pixel 200, and overlap the first well bunker area WBA1 and the first bunker disconnection area BDA1, respectively.

Thus, the first to fourth well bunker areas WBA1 to WBA4 may be rotationally symmetrical with each other around the pixel 200.

The first to fourth well bunker areas WBA1 to WBA4 may be asymmetrical with each other, based on a first straight line extended in the first direction through the center of the pixel 200 or a second straight line extended in the second direction through the center of the pixel 200. That is, the first bunker disconnection area BDA1 may be located on the top side of the first straight line, and the third bunker disconnection area BDA3 disposed on the opposite side of the first bunker disconnection area BDA1 with respect to the second straight line may be located on the bottom side of the first straight line. Furthermore, the second bunker disconnection area BDA2 may be located on the right side of the second straight line, and the fourth bunker disconnection area BDA4 disposed on the opposite side of the second bunker disconnection area BDA2 with respect to the first straight line may be located on the left side of the second straight line.

Thus, the first to fourth well bunker areas WBA1 to WBA4 may be bilaterally asymmetrical with each other with respect to the first or second straight line.

Figure 3:
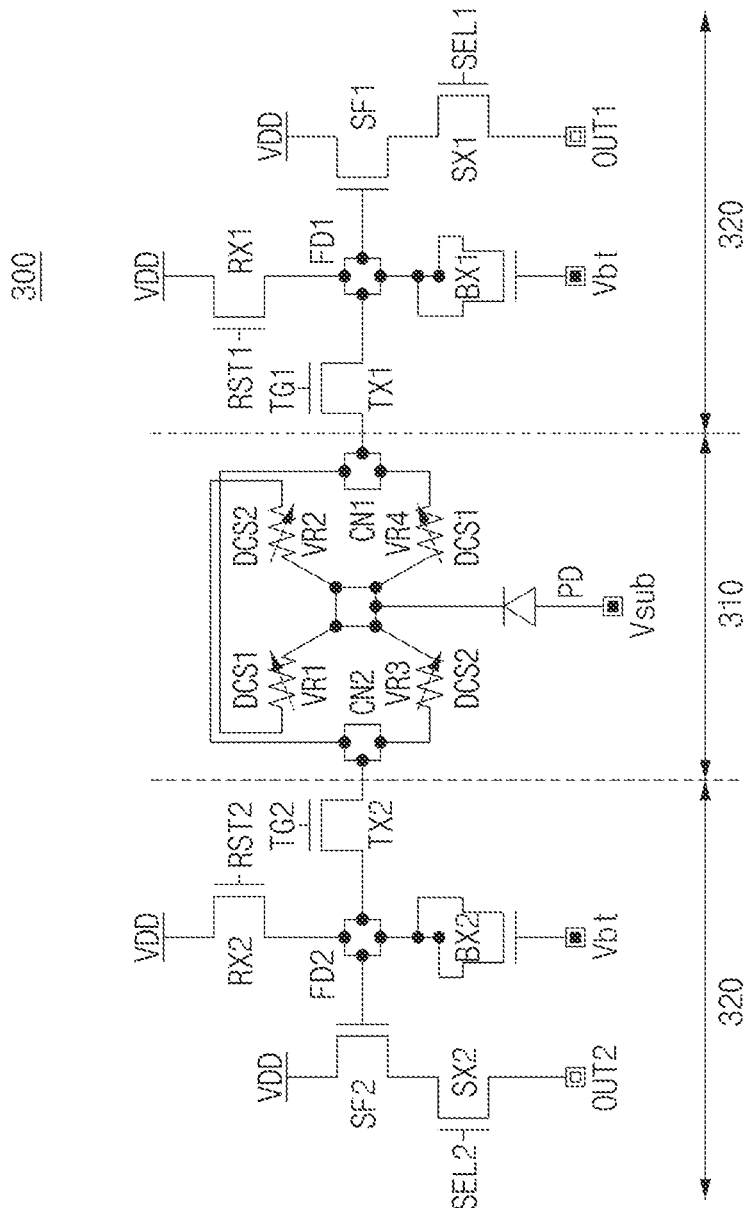
FIG. 3 is a circuit diagram of the pixel illustrated in FIG. 2.

FIG. 3 is a circuit diagram of the pixel illustrated in FIG. 2.

Referring to FIG. 3, a pixel 300 has a configuration obtained by illustrating the pixel 200 of FIG. 2 as a circuit diagram. The pixel 300 may roughly include a photoelectric conversion area 310 and a circuit area 320.

The photoelectric conversion area 310 may include a photoelectric conversion element PD and first to fourth variable resistors VR1 to VR4.

The photoelectric conversion element PD may generate and accumulate photocharges corresponding to the intensity of incident light.

As described above, the first to fourth taps TA1, TB2, TB3 and TA4 may be formed in the substrate. As light is incident, photocharges corresponding to the intensity of the incident light may be generated and accumulated in the substrate. That is, the photoelectric conversion element PD may correspond to an area of the substrate, where photocharges are generated by incident light.

One side of the photoelectric conversion element PD may be coupled to the first to fourth variable resistors VR1 to VR4, and the other side of the photoelectric conversion element PD may receive a substrate voltage Vsub. The substrate voltage Vsub may be a substrate voltage which is applied to a surface doping area 404 which will be described with reference to FIG. 4.

The first variable resistor VR1 may be coupled between the one side of the photoelectric conversion element PD and a first common node CN1. The first variable resistor VR1 may transfer the photocharges accumulated in the photoelectric conversion element PD to the first common node CN1 in response to a first demodulation control signal DCS1. The first demodulation control signal DCS1 may have an active voltage (e.g. 1.2 V) and an inactive voltage (e.g. 0 V).

When the first demodulation control signal DCS1 has the active voltage, the first variable resistor VR1 may have relatively low resistance such that the photocharges accumulated in the photoelectric conversion element PD are transferred to the first common node CN1. When the first demodulation control signal DCS1 has the inactive voltage, the first variable resistor VR1 may have relatively high resistance such that the photocharges accumulated in the photoelectric conversion element PD are not transferred to the first common node CN1.

The second variable resistor VR2 may be coupled between the one side of the photoelectric conversion element PD and a second common node CN2. The second variable resistor VR2 may transfer the photocharges accumulated in the photoelectric conversion element PD to the second common node CN2 in response to a second demodulation control signal DCS2. The second demodulation control signal DCS2 may have the active voltage (e.g. 1.2 V) and the inactive voltage (e.g. 0 V).

When the second demodulation control signal DCS2 has the active voltage, the second variable resistor VR2 may have relatively low resistance such that the photocharges accumulated in the photoelectric conversion element PD are transferred to the second common node CN2. When the second demodulation control signal DCS2 has the inactive voltage, the second variable resistor VR2 may have relatively high resistance such that the photocharges accumulated in the photoelectric conversion element PD are not transferred to the second common node CN2.

The third variable resistor VR3 may be coupled between the one side of the photoelectric conversion element PD and the second common node CN2 in parallel to the second variable resistor VR2, and transfer the photocharges accumulated in the photoelectric conversion element PD to the second common node CN2 in response to the second demodulation control signal DCS2. Since the operation of the third variable resistor VR3 is performed in substantially the same manner as that of the second variable resistor VR2, the overlapping descriptions thereof will be omitted therein.

The fourth variable resistor VR4 may be coupled between the one side of the photoelectric conversion element PD and the first common node CN1 in parallel to the first variable resistor VR1, and transfer the photocharges accumulated in the photoelectric conversion element PD to the first common node CN1 in response to the first demodulation control signal DCS1. Since the operation of the fourth variable resistor VR4 is performed in substantially the same manner as that of the first variable resistor VR1, the overlapping descriptions thereof will be omitted therein.

The first to fourth variable resistors VR1 to VR4 may correspond to components configured by modeling the first to fourth taps TA1, TB2, TB3 and TA4 as circuit elements, respectively.

Hereafter, the actual operations of the first to fourth taps TA1, TB2, TB3 and TA4 will be described. Since the operation of the third tap TB3 and the operation of the fourth tap TA4 correspond to the operation of the second tap TB2 and the operation of the first tap TA1, respectively, the following descriptions will be focused on the operations of the first and second taps TA1 and TB2.

The first tap TA1 may include the first control node CA1 and the first detection node DA1, and the second tap TB2 may include the second control node CB2 and the second detection node DB2.

The first and second control nodes CA1 and CB2 and the first and second detection nodes DA1 and DB2 may be formed in the substrate. Such a control node may be doped to exhibit a conductivity type of either the N-type conductivity or P-type conductivity based on the dopants used for the doping. For example, the substrate may be a P-type semiconductor substrate, the first and second control nodes CA1 and CB2 may be P-type impurity areas doped with one or more P-type impurity materials, and the first and second detection nodes DA1 and DB2 may be N-type impurity areas doped with one or more N-type impurity materials. In the present embodiment, the P-type may be defined as a first conductive type, and the N-type may be defined as a second conductive type.

The first and second control nodes CA1 and CB2 may be disposed to abut on the guide well area GW, and the guide well area GW may be an N-type impurity area. That is, the first and second control nodes CA1 and CB2 each formed as P-type impurity areas may each form a PN junction between the corresponding control node and the guide well area GW formed as an N-type impurity area. Thus, the guide well area GW may include depletion areas adjacent to the first and second control nodes CA1 and CB2, respectively.

The first and second control nodes CA1 and CB2 may receive first and second demodulation control signals DCS1 and DCS1, respectively, from the demodulation driver 42. The potential difference between the first and second demodulation control signals DCS1 and DCS2 generates a potential gradient to control a flow of photocharges generated as signal carriers in the substrate by incident light. When the potential of the first demodulation control signal DCS1 is higher than that of the second demodulation control signal DCS2, the potential difference therebetween forms the potential gradient at which the potential decreases from the first control node CA1 toward the second control node CB2. When the potential of the first demodulation control signal DCS1 is lower than that of the second demodulation control signal DCS2, the potential difference therebetween forms the potential gradient at which the potential decreases from the second control node CB2 toward the first control node CA1.

Each of the first and second detection nodes DA1 and DB2 may perform a function of capturing and accumulating photocharges which migrate from the low potential area to the high potential area, along the potential gradient.

According to an embodiment, the photocharge capturing operation of the photoelectric conversion area 310 may be performed over first and second periods, which are sequential time periods. In the present embodiment, the image sensing device operates according to a 2-phase demodulation method in which the first to fourth taps TA1, TB2, TB3 and TA4 use two kinds of demodulation control signals. In another embodiment, the image sensing device may operate according to a 4-phase demodulation method in which the first to fourth taps TA1, TB2, TB3 and TA4 use four kinds of demodulation control signals. In some implementations, the different demodulation control signals may have different phase differences from one another with respect to the light modulation signal MLS.

In the first period, light incident into the pixel 300 may be photoelectrically converted according to the photoelectric effect, and generate electron-hole pairs corresponding to the intensity of the incident light. In the present embodiment, electrons generated in response to the intensity of the incident light may indicate photocharges. At this time, the demodulation driver 42 may apply the first demodulation control signal DCS1 to the first control node CA1, and apply the second demodulation control signal DCS2 to the second control node CB2. The voltage of the first demodulation control signal DCS1 may be higher than that of the second demodulation control signal DCS2. Thus, the first demodulation control signal DCS1 may be set to the active voltage (e.g. 1.2 V), and the second demodulation control signal DCS2 may be set to the inactive voltage (e.g. 0 V).

The voltage difference between the voltage of the first demodulation control signal DCS1 and the voltage of the second demodulation control signal DCS2 may form the potential gradient at which the potential increases toward the first control node CA1. Thus, the electrons within the substrate migrate toward the first control node CA1.

Electrons may be generated in the substrate in response to the luminous intensity of incident light, and the generated electrons may be migrated toward the first control node CA1 and captured by the first detection node DA1 adjacent to the first control node CA1. Therefore, the electrons within the substrate may be used as signal carriers for detecting the luminous intensity of the incident light.

In the second period following the first period, light incident into the pixel 300 may be photoelectrically converted according to the photoelectric effect, and generate electron-hole pairs corresponding to the intensity of the incident light. At this time, the demodulation driver 42 may apply the first demodulation control signal DCS1 to the first control node CA1, and apply the second demodulation control signal DCS2 to the second control node CB2. The voltage of the first demodulation control signal DCS1 may be lower than that of the second demodulation control signal DCS2. At this time, the voltage of the first demodulation control signal DCS1 may be the inactive voltage (e.g. 0 V), and the voltage of the second demodulation control signal DCS2 may be the active voltage (e.g. 1.2 V).

The voltage difference between the voltage of the first demodulation control signal DCS1 and the voltage of the second demodulation control signal DCS2 may form the potential gradient at which the potential increases toward the second control node CB2. Thus, the electrons within the substrate migrate toward the second control node CB2.

Thus, electrons may be generated in the substrate in response to the luminous intensity of incident light, and the generated electrons may be migrated toward the second control node CB2 and captured by the second detection node DB2 adjacent to the second control node CB2. Therefore, the electrons within the substrate may be used as signal carriers for detecting the luminous intensity of the incident light.

According to an embodiment, the order of the first and second periods may be changed.

In the first period in which the first demodulation control signal DCS1 having the active voltage is applied to the first and fourth taps TA1 and TA4 and the second demodulation control signal DCS2 having the inactive voltage is applied to the second and third taps TB2 and TB3, the photocharges generated in the substrate may be captured by the first and fourth taps TA1 and TA4 and accumulated in the first common node CN1. The first and fourth detection nodes DA1 and DA4 may be electrically coupled to each other to form one first common node CN1.

In the second period in which the first demodulation control signal DCS1 having the inactive voltage is applied to the first and fourth taps TA1 and TA4 and the second demodulation control signal DCS2 having the active voltage is applied to the second and third taps TB2 and TB3, the photocharges generated in the substrate may be captured by the second and third taps TB2 and TB3 and accumulated in the second common node CN2. The second and third detection nodes DB2 and DB3 may be electrically coupled to each other to form one second common node CN2.

The circuit area 320 may include a plurality of elements for converting the photocharges, captured by the first to fourth detection nodes DA1, DB2, DB3 and DA4, into electric signals by processing the photocharges. Control signals RST1, RST2, TG1, TG2, SEL1, SEL2 and Vbt supplied to the plurality of elements may be supplied from the row driver 41. The pixel voltage VDD may be a supply voltage.

First, the elements for processing the photocharges accumulated in the first common node CN1 will be described. The circuit area 320 may include a first reset transistor RX1, a first transmission transistor TX1, a first boosting transistor BX1, a first source follower transistor SF1 and a first selection transistor SX1.

The first reset transistor RX1 may be turned on in response to a logic high level of a first reset signal RST1 supplied to a gate thereof, and reset the potentials of a first floating diffusion node FD1 and the first common node CN1 to a predetermined level (i.e. a pixel voltage VDD). Furthermore, when the first reset transistor RX1 is turned on, the first transmission transistor TX1 may be simultaneously turned on to reset the first common node CN1.

The first transmission transistor TX1 may be turned on in response to a logic high level of a first transmission signal TG1 supplied to a gate thereof, and transmit the photocharges accumulated in the first common node CN1 to the first floating diffusion node FD1.

The first boosting transistor BX1 may provide an additional capacitance to the first floating diffusion node FD1 in response to a boosting voltage Vbt supplied to a gate thereof. The first boosting transistor BS1 may be coupled to the first floating diffusion node FD1 while source and drain thereof form one node, and thus operate as a capacitive element (e.g. MOS (Metal-Oxide-Semiconductor) capacitor) and have a capacitance corresponding to the boosting voltage Vbt.

The row driver 41 may adjust the capacitance of the first floating diffusion node FD1 by controlling the boosting voltage Vbt according to the luminous intensity of incident light. Thus, under a high luminance condition, the first floating diffusion node FD1 may accumulate more photocharges, which makes it possible to secure a high dynamic range.

According to another embodiment, the boosting voltage Vbt may be constantly retained to continuously provide a predetermined capacitance to the first floating diffusion node FD1.

According to still another embodiment, the first boosting transistor BX1 may be omitted.

The first source follower transistor SF1 may have a drain coupled to the pixel voltage VDD and a source coupled to the first selection transistor SX1, and transfer a current, corresponding to the potential of the first floating diffusion node FD1 coupled to a gate thereof, to the first selection transistor SX1.

The first selection transistor SX1 may be turned on in response to a logic high level of a first selection signal SEL1 supplied to a gate thereof, and output a first pixel output signal OUT1 transferred from the first source follower transistor SF1. The first pixel output signal OUT1 may be transferred to the readout circuit 45 through a vertical signal line (not illustrated) extended in the column direction of the pixel array 30.

In order to process the photocharges accumulated in the second common node CN2, the circuit area 320 may include a second reset transistor RX2, a second transmission transistor TX2, a second boosting transistor BX2, a second source follower transistor SF2 and a second selection transistor SX2. Since the elements for processing the photocharges accumulated in the second common node CN2 are configured and operated in substantially the same manner as the above-described elements for processing the photocharges accumulated in the first common node CN1 except operation timings, the overlapping descriptions thereof will be omitted herein.

The first demodulation control signal DCS1 may be exactly out of phase with the second demodulation control signal DCS2. For example, the first demodulation control signal DCS1 may have the same phase as the light modulation signal MLS, and the second demodulation control signal DCS2 may have a phase difference of 180 degrees from the light modulation signal MSL. Therefore, the operation timings of the elements RX1, TX1, BX1, SF1 and SX1 for processing the photocharges accumulated in the first common node CN1 in response to the first demodulation control signal DCS1 may be different from those of the elements RX2, TX2, BX2, SF2 and SX2 for processing the photocharges accumulated in the second common node CN2 in response to the second demodulation control signal DCS2.

The pixel output signals OUT1 and OUT2 outputted to the readout circuit 45 from the circuit area 320 may be converted into image data through noise removal and analog-digital conversion.

An image processor (not illustrated) may calculate a phase difference from the light modulation signal MLS by performing an operation on the image data acquired from the photocharges accumulated in the first common node CN1 and the image data acquired from the photocharges accumulated in the second common node CN2, calculate depth information, indicating the distance to a target object 1, from the phase difference corresponding to each pixel, and generate a depth image including the depth information corresponding to each pixel.

Figure 4:
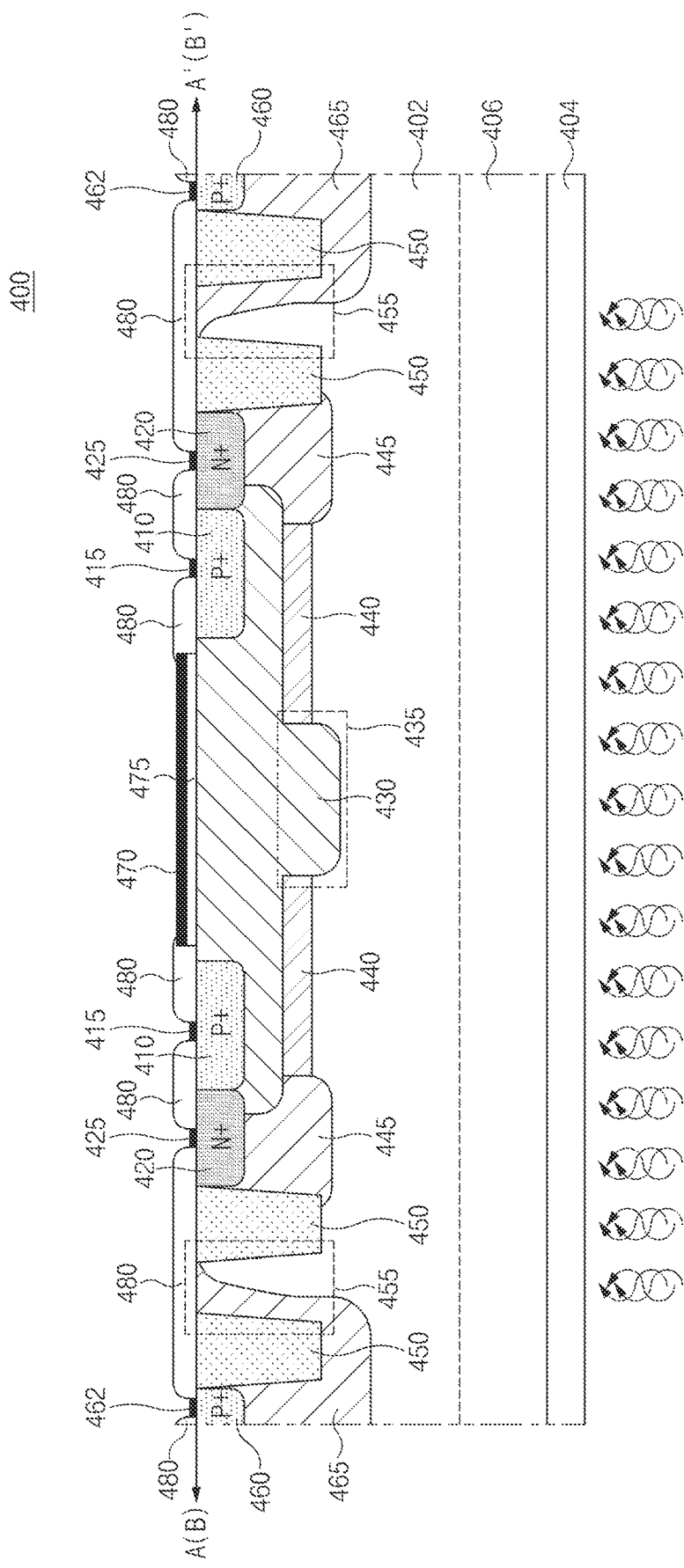
FIG. 4 is a diagram of an example of a cross-section obtained by cutting the pixel along a first or second cutting line of FIG. 2.

FIG. 4 is a diagram of an example of a cross-section obtained by cutting the pixel along a first or second cutting line of FIG. 2.

A cross-section 400 illustrated in FIG. 4 may correspond to the cross-section obtained by cutting the pixel 200 along the first or second cutting line A-A' or B-B' of FIG. 2.

The cross-section 400 may include a substrate 402, a surface doping area 404, a surface depletion area 406, a first doping area 410, a control electrode 415, a second doping area 420, a detection electrode 425, a first well area 430, a second well area 440, a third well area 445, an STI area 450, a well bunker area 455, a third doping area 460, a voltage stabilization electrode 462, a transistor well area 465, a potential control electrode 470, a potential control dielectric layer 475 and a substrate dielectric layer 480.

The substrate 402 may be a semiconductor substrate, for example, a P-type bulk substrate, a substrate obtained by growing a P-type epitaxial layer in a P-type bulk substrate, or a substrate obtained by growing P-type epitaxial layer in an N-type bulk substrate. According to another embodiment, the substrate 402 may be an N-type bulk substrate, a substrate obtained by growing an N-type epitaxial layer in a P-type bulk substrate, or a substrate obtained by growing an N-type epitaxial layer in an N-type bulk substrate. In the present embodiment, it is assumed that the substrate 402 corresponds to an N-type epitaxial layer.

While FIG. 4 illustrates that the components 404, 406, 410, 415, 420, 425, 430, 440, 445, 450, 455, 460, 462 and 465 are disposed over the substrate 402, but, the substrate 402 disposed under those components can be considered as a part of the substrate. The components 404, 406, 410, 415, 420, 425, 430, 440, 445, 450, 455, 460, 462 and 465 are formed through separate subsequent processes (e.g. an implant process, a trench process, or others) in the substrate and thus the components 404, 406, 410, 415, 420, 425, 430, 440, 445, 450, 455, 460, 462 and 465 can be considered as formed in the substrate. In the implementation, the substrate has a top surface (e.g. a surface abutting on the first doping area 410) and a bottom surface (e.g. a surface abutting on the surface doping area 404), the top and bottom surfaces facing each other.

The surface doping area 404 may be disposed in the substrate 402 along the surface of the substrate 402, on which light is incident, and include a P-type impurity having a higher doping concentration than the substrate 402. According to an embodiment, the surface doping area 404 may form a potential gradient in the relationship with a tap activated by the substrate voltage applied thereto, such that photocharges generated around the surface of the substrate 402 may be detected in the activated tap. For example, the substrate voltage may be a voltage lower than the active voltage, for example, the inactive voltage.

The surface depletion area 406 may be formed by a PN junction between the substrate 402 and the surface doping area 404, as the surface doping area 404 is implanted into the substrate 402. In the surface depletion area 406, no carriers (i.e. holes and electrons) are present. Although the surface depletion area 406 is designed to have no carriers, one of ordinary skill in the art could understand that very little carriers can still exist due to various reasons and the disclosed technology does not exclude such case. The surface depletion area 406 may reduce or prevent a hole current which may flow between the surface doping area 404 and the activated tap, thereby reducing unnecessary power consumption.

The first doping area 410 may correspond to the first control node CA1 and the fourth control node CA4, when the cross-section 400 corresponds to the first cutting line A-A', and correspond to the second control node CB2 and the third control node CB3 when the cross-section 400 corresponds to the second cutting line B-B'. The first doping area 410 may be an area formed by implanting a P+-type impurity having a relatively high doping concentration into the substrate 402.

The control electrode 415 may receive the first or second demodulation control signal DCS1 or DCS2 from the demodulation driver 42, and transfer the first or second demodulation control signal DCS1 or DCS2 to the first doping area 410. The control electrode 415 may include polysilicon or metal with high electrical conductivity. The control electrode 415 may be formed on one surface of the substrate 402.

The second doping area 420 may correspond to the first detection node DA1 and the fourth detection node DA4, when the cross-section 400 corresponds to the first cutting line A-A', and correspond to the second detection node DB2 and the third detection node DB3 when the cross-section 400 corresponds to the second cutting line B-B'. The second doping area 420 may be an area formed by implanting an N+-type impurity having a relatively high doping concentration into the substrate 402.

The detection electrode 425 may transfer photocharges (i.e. electrons), captured by the second doping area 420, to the first or second transmission transistor TX1 or TX2. Since the second doping area 420 forms one node, the photocharges accumulated in the second doping area 420 may be outputted through the detection electrode 425 which is formed to correspond to a portion of the second doping area 420. Therefore, the detection electrode 425 does not need to be formed across the entire second doping area 420. In the present embodiment, the detection electrode 425 may be formed in a region of the second doping area 420, which overlaps the first or second cutting line A-A' or B-B'. The detection electrode 425 may include polysilicon or metal with high electrical conductivity. The detection electrode 425 may be formed on one surface of the substrate 402.

The first well area 430 may correspond to the guide well area GW described with reference to FIG. 2.

The first well area 430 may be disposed between the first doping areas 410 so as to abut on the one surface of the substrate 402, while surrounding the first doping areas 410. Furthermore, the first well area 430 may be extended to abut on portions of the second doping areas 420. Furthermore, the first well area 430 may be disposed to abut on the second and third well areas 440 and 445 which are disposed at the bottom and side surfaces thereof, respectively. The first well area 430 may be extended toward the back surface of the substrate 402 through an open region where the second well area 440 is not disposed, around the center of the pixel 200. The extended region of the first well area 430 may be defined as a well opening 435. The well opening 435 may correspond to the well opening WO described with reference to FIG. 2.

The shape of the first well area 430 may be formed around the center of the pixel 200 through the top surface of the substrate 402 through an impurity implant process, after the first doping area 410, the second doping area 420, the second well area 440 and the third well area 445 are sequentially formed.

The first well area 430 may include an N-type impurity having a lower doping concentration than the doping concentrations of the first and second doping areas 410 and 420.

The second well area 440 may be spaced, by a predetermined distance, apart from the first doping areas 410, and extended in parallel to the one surface of the substrate 402 while overlapping the first doping areas 410. As described above, the second well area 440 may be open or omitted around the center of the pixel 200, and the first well area 430 may have the well opening 435 extended to a predetermined depth toward the bottom (the back surface of the substrate 402) through the open region. The second well area 440 may include a P-type impurity having a lower doping concentration than the doping concentrations of the first and second doping areas 410 and 420.

The third well area 445 may be extended downward along the side surfaces of the first and second well areas 430 and 440, while abutting on the second doping areas 420. The third well area 445 may include a P-type impurity having a lower doping concentration than the doping concentrations of the first and second doping areas 410 and 420. The third well area 445 may be formed to have a larger depth from the one surface of the substrate 402 than the second well area 440.

The second well area 440 may be disposed to overlap the first doping area 410, and the third well area 445 may be disposed to overlap the second doping area 420. The second and third well areas 440 and 445 may constitute the bottom well area described with reference to FIG. 2. Thus, the second and third well areas 440 and 445 may correspond to the first or fourth bottom well area BW1 or BW4 when the cross-section 400 corresponds to the first cutting line A-A', and correspond to the second or third bottom well area BW2 or BW3 when the cross-section 400 corresponds to the second cutting line B-B'.

The second and third well areas 440 and 445 including a P-type impurity may each have a depletion area at the boundary between the substrate 402 and the first well area 430 including an N-type impurity, and the depletion area may block the photocharges, generated in the substrate 402, from flowing through the second and third well areas 440 and 445. As the second and third well areas 440 and 445 are disposed under the first and second doping areas 410 and 420 and the first well area 430 is disposed between the first and second doping areas 410 and 420 and the second and third well areas 440 and 445, the photocharges may be guided to rapidly migrate to an activated tap through the depletion area of the first well area 430.

The STI area 450 may correspond to the STI area STI of FIG. 2. The STI area 450 may have a structure in which a trench is formed to a predetermined depth from the one surface of the substrate 402 through the STI process, and filled with a dielectric material.

The well bunker area 455 may correspond to the first well bunker area WBA1 and the fourth well bunker area WBA4 when the cross-section 400 corresponds to the first cutting line A-A', and correspond to the second well bunker area WBA2 and the third well bunker area WBA3 when the cross-section 400 corresponds to the second cutting line B-B'. As described with reference to FIG. 2, the well bunker area 455 may have no trench and dielectric material disposed therein, and the STI area 450 may correspond to a disconnected area.

The third doping area 460 may correspond to the first and fourth voltage stabilization areas VS1 and VS4 when the cross-section 400 corresponds to the first cutting line A-A', and correspond to the second and third voltage stabilization areas VS2 and VS3 when the cross-section 400 corresponds to the second cutting line B-B'. The third doping area 460 may be a P+-type impurity area doped at a higher concentration than the transistor well area 465.

The voltage stabilization electrode 462 may be disposed to abut on the top of the third doping area 460, and transfer the inactive voltage to the third doping area 460.

The transistor well area 465 may correspond to a P-well disposed under the pixel transistor area PTA of FIG. 2 and the corresponding voltage stabilization area. The transistor well area 465 may include a P-type impurity having a lower doping concentration than the third doping area 460, and form the body of a pixel transistor so as to decide an element characteristic (e.g. threshold voltage) of the pixel transistor.

At least a portion of the transistor well area 465 may be disposed in the well bunker area 455. Furthermore, at least a portion of the boundary between the transistor well area 465 and the substrate 402 may be disposed in the well bunker area 455. According to the sequence of the entire process, an implant process of the transistor well area 465 may be performed after the trench of the STI area 450 is formed.

When it is assumed that the well bunker area 455 is not present but the well bunker area 455 is filled with the STI area 450, the transistor well area 465 may be diffused farther along the bottom surface of the STI area 450 and disposed closer to the well opening 435, during the implant process of the transistor well area 465. The third doping area 460 to which the inactive voltage is applied may generate a hole current in the relationship with the first doping area 410 to which the active voltage is applied. Such a hole current flows through the transistor well area 465 having relatively low resistance, and then passes through the boundary between the substrate 402 and the transistor well area 465 including a P-type impurity, i.e. the boundary having relatively high resistance due to the depletion area. When the transistor well area 465 is disposed closer to the well opening 435 as assumed above, the hole current may easily migrate to a location close to the well opening 435. Thus, the hole current may more easily flow between the first doping area 410 and the third doping area 460.

In the present embodiment, however, when the well bunker area 455 is disposed in the STI area 450, the transistor well area 465 may be diffused into the well bunker area 455 (i.e. to the top surface of the substrate 402 along the side surface of the STI area 450), and disposed farther away from the well opening 435, during the implant process of the transistor well area 465. As such, when the transistor well area 465 is disposed farther away from the well opening 435, the hole current may not easily migrate to a location close to the well opening 435, which makes it possible to prevent the hole current from easily flowing between the first doping area 410 and the third doping area 460.

The potential control electrode 470 and the potential control dielectric layer 475 may correspond to the potential control area PC of FIG. 2. The potential control electrode 470 and the potential control dielectric layer 475 may be stacked over the one surface of the substrate 402. The potential control electrode 470 may include polysilicon or metal with high electrical conductivity. The potential control dielectric layer 475 may include one or more of silicon oxynitride ($Si_xO_yN_z$), silicon oxide ($SixO_y$) and silicon nitride ($Si_xN_y$) where x, y and z are natural numbers.

As the potential control voltage is applied to the potential control electrode 470, the potential control electrode 470 may control the potential of the first well area 430 corresponding to the bottom of the potential control dielectric layer 475, and form a potential gradient at which photocharges easily migrate toward an activated tap. Due to a micro-lens (not illustrated) which is disposed to overlap the pixel 200 in order to concentrate light into the pixel 200, the largest amount of photocharge may be generated at a location close to the center of the pixel 200. Therefore, as the well opening 435 is disposed in the center of the pixel 200 and the potential gradient for inducing photocharges to activated taps is formed by the potential control area PC, photocharges generated in the corresponding time period may be effectively captured by the activated taps, which makes it possible to improve the sensitivity and demodulation contrast of the pixel 200.

The substrate dielectric layer 480 may electrically insulate a region of the one surface of the substrate, to which no signal needs to be applied or outputted. The substrate dielectric layer 480 may be formed on the one surface of the substrate 402. For example, the substrate dielectric layer 480 may include one or more of silicon oxynitride ($Si_xO_yN_z$), silicon oxide ($Si_xO_y$) and silicon nitride ($Si_xN_y$) where x, y and z are natural numbers.

Figure 5:
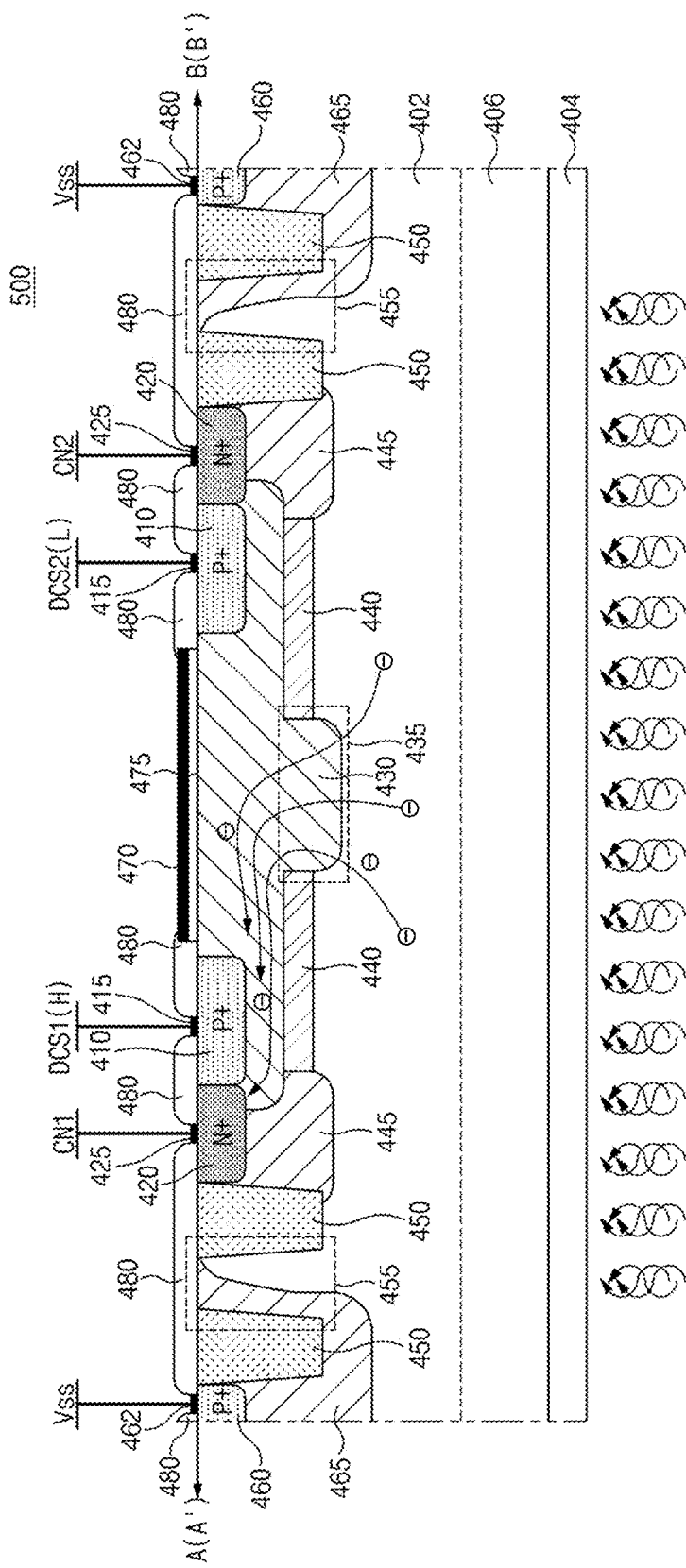
FIG. 5 is a diagram illustrating photocharge flows on a cross-section of the pixel in a first period.

FIG. 5 is a diagram illustrating photocharge flows in the pixel in the first period.

A cross-section 500 of FIG. 5 may correspond to a cross-section obtained by cutting the pixel 200 along a third or fourth cutting line A-B or A'-B.'

When the cross-section 500 is obtained by cutting the pixel 200 along the third cutting line A-B, the first doping areas 410 may correspond to the first control node CA1 and the third control node CB3, respectively, the second doping areas 420 may correspond to the first detection node DA1 and the third detection node DB3, respectively, and the third doping areas 460 may correspond to the first voltage stabilization area VS1 and the third voltage stabilization area VS3, respectively.

When the cross-section 500 is a cross-section obtained by cutting the pixel 200 along the fourth cutting line A'-B', the first doping areas 410 may correspond to the fourth control node CA4 and the second control node CB2, respectively, the second doping areas 420 may correspond to the fourth detection node DA4 and the second detection node DB2, respectively, and the third doping areas 460 may correspond to the fourth voltage stabilization area VS4 and the second voltage stabilization area VS2, respectively.

Since the cross-section 500 of FIG. 5 is substantially the same as the cross-section 400 of FIG. 4, the overlapping descriptions thereof will be omitted herein.

In the first period in which the first and fourth taps TA1 and TA4 are activated, the left first doping area 410 corresponding to the first or fourth control node CA1 or CA4 may receive the first demodulation control signal DCS1 having the active voltage, and the right first doping area 410 corresponding to the second or third control node CB2 or CB3 may receive the second demodulation control signal DCS2 having the inactive voltage.

Since a relatively high voltage is applied to the left first doping area 410 and a relatively low voltage is applied to the right first doping area 410, the voltage of the left depletion area within the first well area 430 becomes higher than the voltage of the right depletion area within the first well area 430, in order to retain the PN junction.

Furthermore, the potential control electrode 470 receiving the potential control voltage may form a potential gradient at which the potential increases from the right depletion area toward the left depletion area through the central depletion area including the well opening 435 within the first well area 430, and the photocharges generated in the substrate 402 in response to the intensity of the incident light may be introduced into the well opening 435 along the potential gradient, and then migrated toward the left first doping area 410 and captured by the left second doping area 420. The captured photocharges may be transferred to the first common node CN1 connected to the left second doping area 420.

A ground voltage Vss corresponding to the inactive voltage may be applied to the third doping areas 460. Thus, a hole current may be generated between the left first doping area 410 and the left third doping area 460. However, when the transistor well area 465 is formed, the transistor well area 465 may flow into the well bunker area 455 due to the well bunker area 455. Thus, the distance between the well opening 435 and the boundary between the well bunker area 455 and the substrate 402 may be further increased. Furthermore, due to the presence of the second and third well areas 440 and 445, a hole current generated by the left first doping area 410 and the left third doping area 460 inevitably flows through the well opening 435. Therefore, a resistance element which is present on the path of the hole current generated by the left first doping area 410 and the left third doping area 460 may be considerably increased. As a result, the magnitude of the hole current generated along such a path may be significantly decreased.

Figure 6:
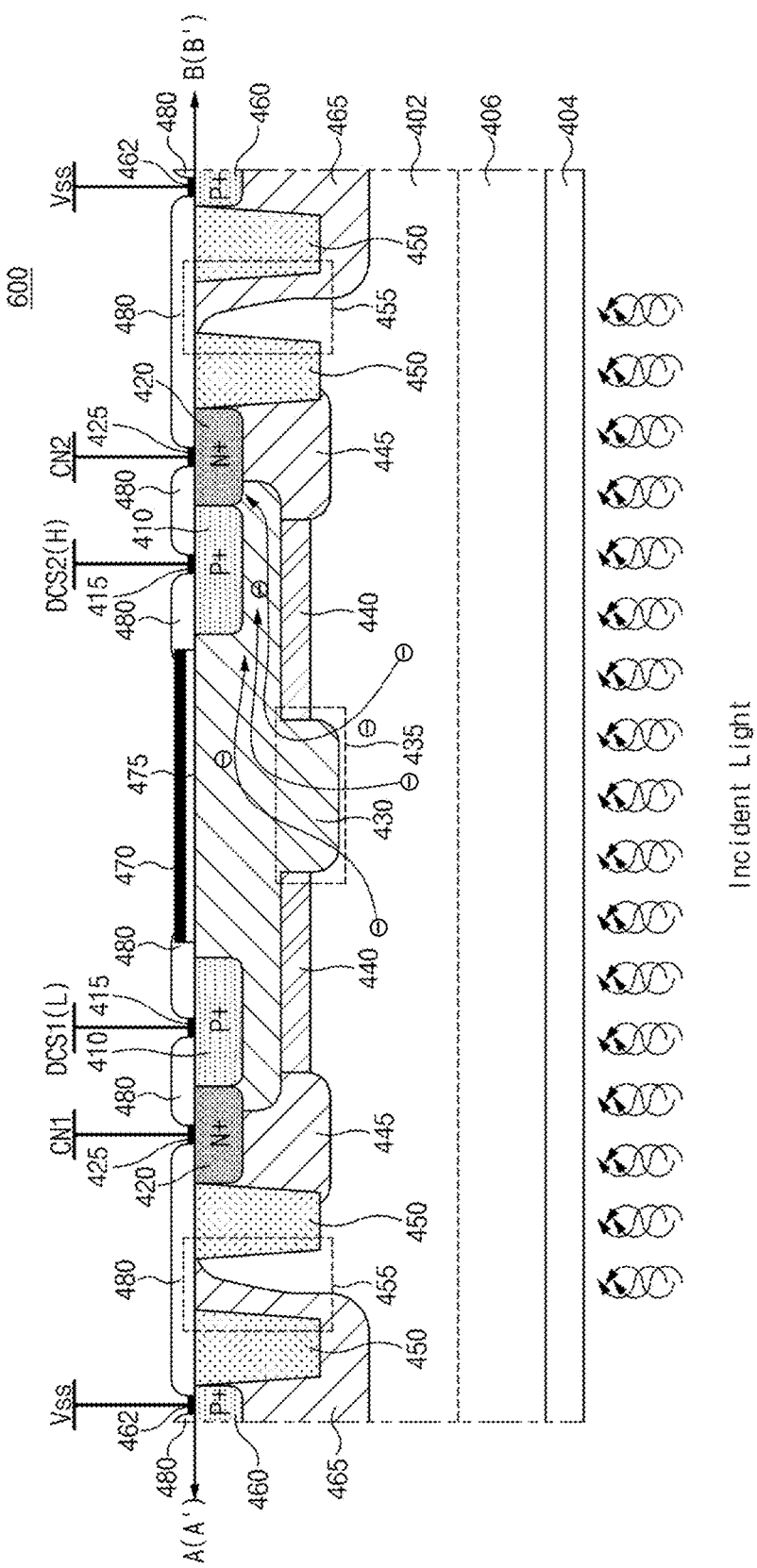
FIG. 6 is a diagram illustrating photocharge flows on a cross-section of the pixel in a second period.

FIG. 6 is a diagram illustrating photocharge flows in the pixel in the second period.

A cross-section 600 of FIG. 6 may correspond to a cross-section obtained by cutting the pixel 200 along the third or fourth cutting line A-B or A'-B.'

In the second period in which the second and third taps TB2 and TB3 are activated, the left first doping area 410 corresponding to the first or fourth control node CA1 or CA4 may receive the first demodulation control signal DCS1 having the inactive voltage, and the right first doping area 410 corresponding to the second or third control node CB2 or CB3 may receive the second demodulation control signal DCS2 having the active voltage.

Since a relatively high voltage is applied to the right first doping area 410 and a relatively low voltage is applied to the left first doping area 410, the voltage of the right depletion area in the first well area 430 becomes higher than the voltage of the left depletion area in the first well area 430, in order to retain the PN junction.

Furthermore, the potential control electrode 470 receiving the potential control voltage may form the potential gradient at which the potential increases from the left depletion area toward the right depletion area through the central depletion area including the well opening 435 within the first well area 430, and the photocharges generated in the substrate 402 in response to the intensity of the incident light may be introduced into the well opening 435 along the potential gradient, and then migrated toward the right first doping area 410 and captured by the right second doping area 420. The captured photocharges may be transferred to the second common node CN2 connected to the right second doping area 420.

The ground voltage Vss corresponding to the inactive voltage may be applied to the third doping areas 460. Thus, a hole current may be generated between the right first doping area 410 and the right third doping area 460. However, when the transistor well area 465 is formed, the transistor well area 465 may flow into the well bunker area 455 due to the well bunker area 455. Thus, the distance between the well opening 435 and the boundary between the well bunker area 455 and the substrate 402 may be further increased. Furthermore, due to the presence of the second and third well areas 440 and 445, the hole current generated by the right first doping area 410 and the right third doping area 460 inevitably flows through the well opening 435. Therefore, a resistance element which is present on the path of the hole current generated by the right first doping area 410 and the right third doping area 460 may be significantly increased. As a result, the magnitude of the hole current generated along such a path may be significantly decreased.

Figure 7:
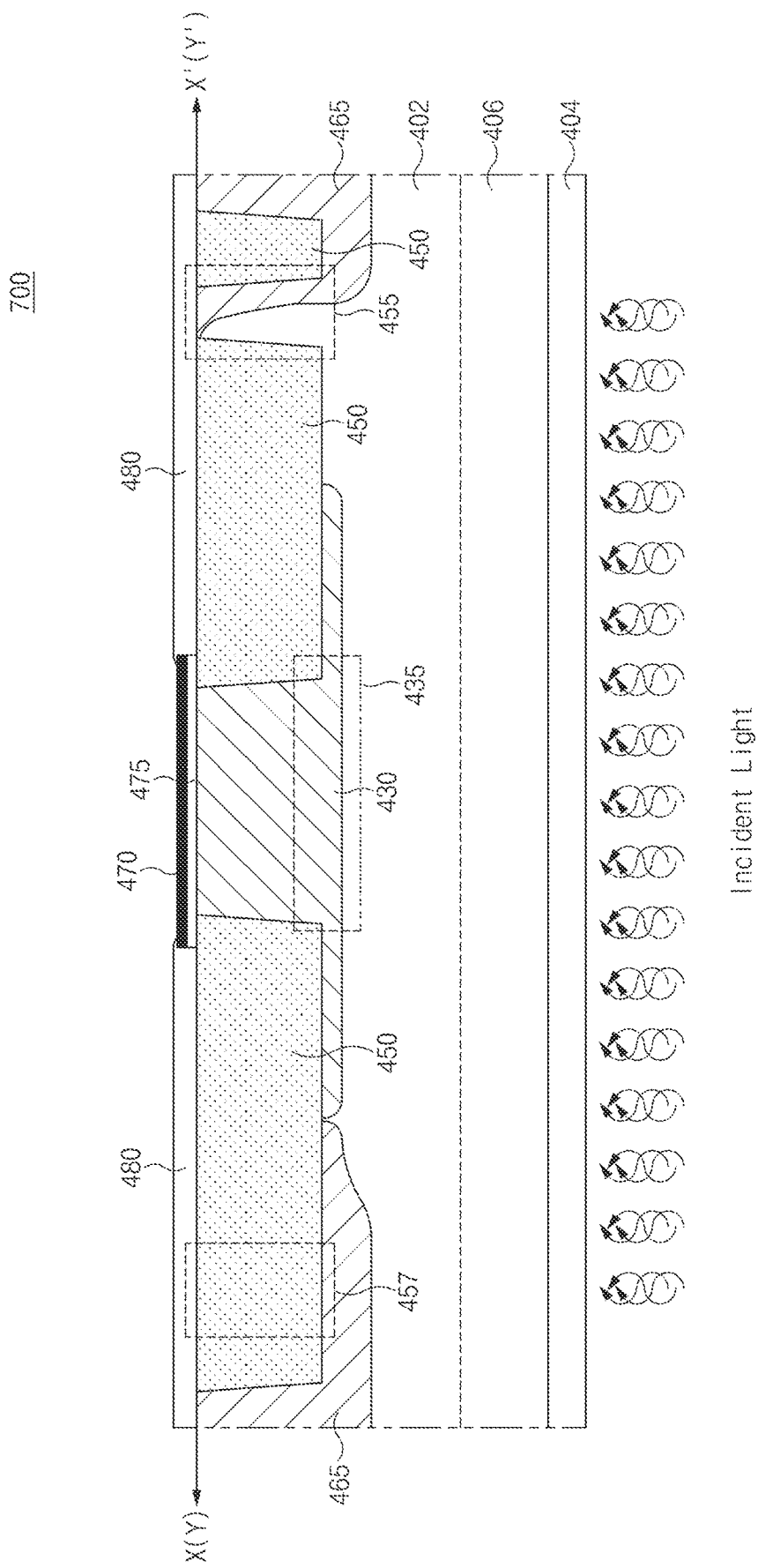
FIG. 7 is a diagram of an example of a cross-section obtained by cutting the pixel along a fifth or sixth cutting line of FIG. 2.

FIG. 7 is a diagram of an example of a cross-section obtained by cutting the pixel along a fifth or sixth cutting line of FIG. 2.

A cross-section 700 of FIG. 7 may correspond to a cross-section obtained by cutting the pixel 200 along the fifth or sixth cutting line X-X' or Y-Y' of FIG. 2.

The cross-section 700 may include the substrate 402, the surface doping area 404, the surface depletion area 406, the first well area 430, the STI area 450, the well bunker area 455, a bunker disconnection area 457, the transistor well area 465, the potential control electrode 470, the potential control dielectric layer 475 and the substrate dielectric layer 480. For the components which have been already described with reference to FIG. 4, the overlapping descriptions thereof will be omitted herein and the descriptions below will be focused on the bunker disconnection area 457.

The bunker disconnection area 457 and the well bunker area 455 may be disposed on the left and right sides of the first well area 430, respectively.

While the well bunker area 455 has a structure in which a trench and dielectric material are omitted therefrom, the bunker disconnection area 457 may include a trench and dielectric material, such that the STI area 450 is continuously connected in the bunker disconnection area 457.

During the implant process of the transistor well area 465, the bunker disconnection area 457 may cause the transistor well area 465 to diffuse farther along the bottom surface of the STI area 450, such that the transistor well area 465 is disposed closer to the well opening 435. When the transistor well area 465 is disposed closer to the well opening 435, a hole current flowing between the third doping area 460 to which the inactive voltage is applied and the first doping area 410 to which the active voltage is applied may easily migrate to a location close to the well opening 435. Thus, the hole current may more easily flow between the first doping area 410 and the third doping area 460.

The hole current between the first doping area 410 and the third doping area 460 hardly flows through the bottom of the well bunker area 455 having relatively large resistance, and may easily flow through the bottom of the bunker disconnection area 457 having relatively small resistance.

Figure 8:
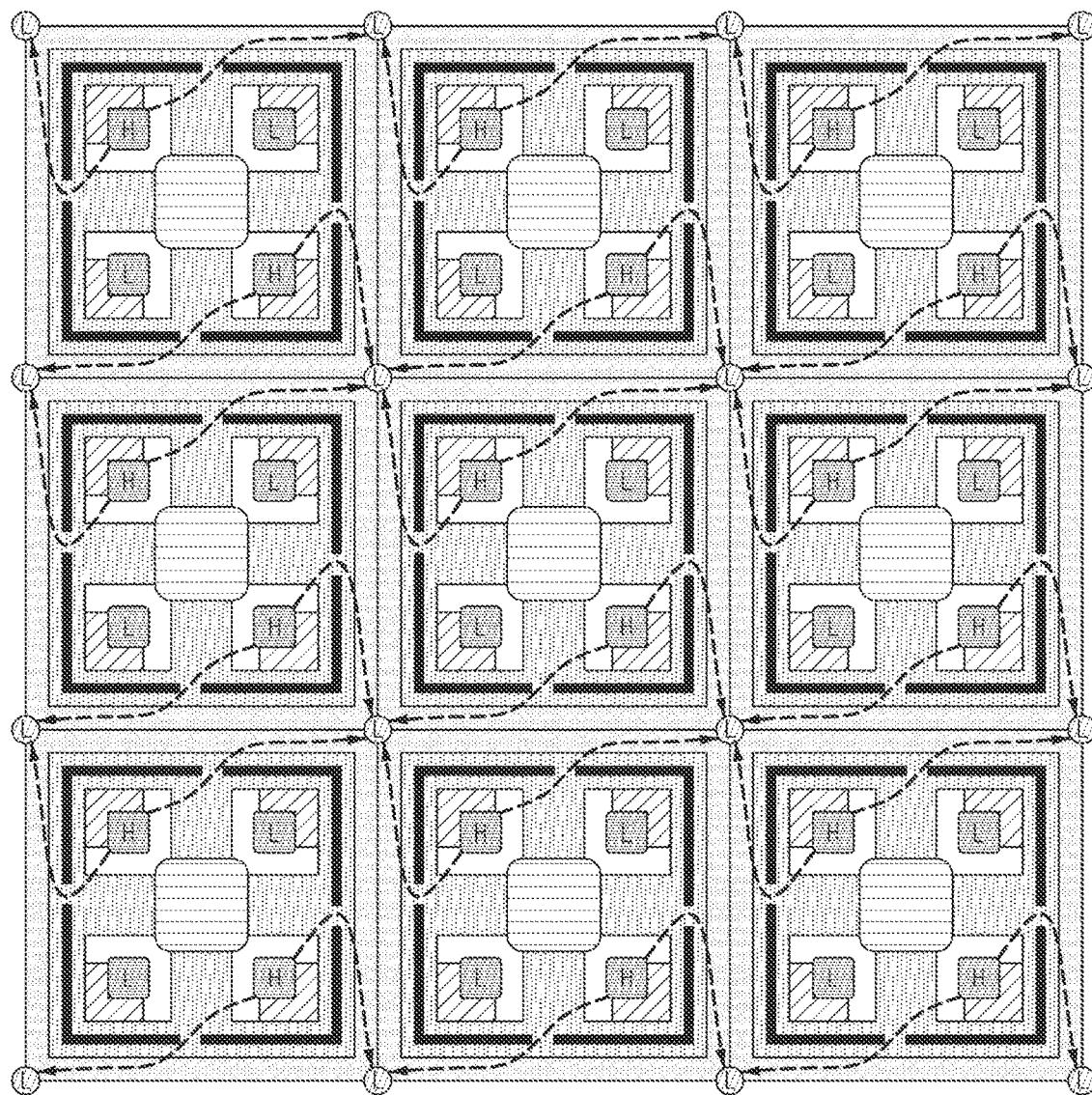
FIG. 8 is a diagram illustrating hole currents flowing through pixels arranged in a matrix in the first period.
Figure 8:
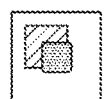
Figure 8:
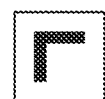
Figure 8:
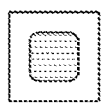
Figure 8:
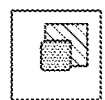
Figure 8:
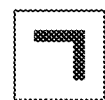
Figure 8:
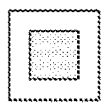
Figure 8:
Figure 8:
Figure 8:
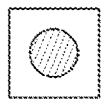
Figure 8:
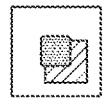
Figure 8:
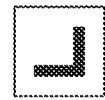
Figure 8:

FIG. 8 is a diagram illustrating hole currents flowing through pixels arranged in a matrix in the first period.

FIG. 8 illustrates nine pixels arranged in a 3×3 matrix including three rows and three columns. In the present embodiment, only nine pixels will be taken as an example, but other implementations are also possible. The following descriptions may be also applied to a pixel array 30 including N pixels which are arranged in a matrix, wherein N is any natural number.

In FIG. 8, the first to fourth taps TA1, TB2, TB3 and TA4, the potential control area PC disposed in the center of each pixel, the voltage stabilization areas VS disposed at the respective vertexes of each pixel, and the pixel transistor area PTA disposed along the edge of each pixel are illustrated as different patterns.

A specific pixel may share the voltage stabilization area VS with a pixel (first adjacent pixel) adjacent in a row direction (i.e. horizontal direction), a pixel (second adjacent pixel) adjacent in a column direction (i.e. vertical direction), a pixel (third adjacent pixel) adjacent in a first diagonal direction, or a pixel (fourth adjacent pixel) adjacent in a second diagonal direction.

Pixels belonging to the first row may be sequentially defined as first to third pixels from the left, pixels belonging to the second row may be sequentially defined as fourth to sixth pixels from the left, and pixels belonging to the third row may be sequentially defined as seventh to ninth pixels from the left. At this time, for the fifth pixel located in the center of the 3×3 matrix, the first adjacent pixel may be the fourth and sixth pixels, the second adjacent pixel may be the second and eight pixels, the third adjacent pixel may be the first and ninth pixels, and the fourth adjacent pixel may be the third and seventh pixels.

The pixel transistor area PTA of the specific pixel may be integrated with the pixel transistor area PTA of the first or second adjacent pixel.

FIG. 8 illustrates hole currents flowing between the activated first tap group and the voltage stabilization areas VS in the first period in which the first and fourth taps TA1 and TA4 belonging to the first tap group are activated and the second and third taps TB2 and TB3 belonging to the second tap group are inactivated. For convenience of description, the following descriptions will be focused on the fifth pixel. However, the same descriptions may also be applied to the other pixels. The first tap group to which the active voltage is applied is marked with an active state H, and the voltage stabilization areas VS and the second tap group to which the inactive voltage is applied each are marked with an inactive state L.

First hole currents HC1 may flow from the first tap group TA1 and TA4 to the voltage stabilization areas VS.

In some implementations, the first tap TA1 may generate the first hole current HC1 toward the first and second voltage stabilization areas adjacent to the first tap TA1. At this time, the first hole current HC1 flowing between the first tap TA1 and the first voltage stabilization area may be outputted from the first tap TA1, and flow along a bending path toward the first bunker disconnection area and pass through the first bunker disconnection area. Then, the first hole current HC1 may flow along a bending path toward the first voltage stabilization area and be inputted to the first voltage stabilization area. Similarly, the first hole current HC1 flowing between the first tap TA1 and the second voltage stabilization area may be outputted from the first tap TA1, and flow along a bending path toward the second bunker disconnection area and pass through the second bunker disconnection area. Then, the first hole current HC1 may flow along a bending path toward the second voltage stabilization area and be inputted to the second voltage stabilization area. This is because the resistance of the bunker disconnection area is considerably lower than the resistance of the well bunker area, and the first hole current HC1 may substantially flow only through the bunker disconnection area. Furthermore, as the first bunker disconnection area is disposed closer to the first voltage stabilization area than the third voltage stabilization area and the second bunker disconnection area is disposed closer to the second voltage stabilization area than the first voltage stabilization area, the above-described flow of the first hole current HC1 may be induced.

In the present embodiment, when the hole current flows through the well bunker area or the bunker disconnection area, it may indicate that the hole current flows through the bottom of the well bunker area or the bunker disconnection area.

The fourth tap TA4 may generate the first hole current HC1 toward the third and fourth voltage stabilization areas adjacent to the fourth tap TA4. At this time, the first hole current HC1 flowing between the fourth tap TA4 and the third voltage stabilization area may be outputted from the fourth tap TA4, and flow along a bending path toward the third bunker disconnection area and pass through the third bunker disconnection area. Then, the first hole current HC1 may flow along a bending path toward the third voltage stabilization area and be inputted to the third voltage stabilization area. Similarly, the first hole current HC1 flowing between the fourth tap TA4 and the fourth voltage stabilization area may be outputted from the fourth tap TA4, and flow along a bending path toward the fourth bunker disconnection area and pass through the fourth bunker disconnection area. Then, the first hole current HC1 may flow along a bending path toward the fourth voltage stabilization area and be inputted to the fourth voltage stabilization area. This is because the resistance of the bunker disconnection area is considerably lower than the resistance of the well bunker area, and the first hole current HC1 may substantially flow only through the bunker disconnection area. Furthermore, as the third bunker disconnection area is disposed closer to the fourth voltage stabilization area than the second voltage stabilization area and the fourth bunker disconnection area is disposed closer to the third voltage stabilization area than the fourth voltage stabilization area, the above-described flow of the first hole current HC1 may be induced.

Thus, the first hole current HC1 intensively flows through a path including the bunker disconnection areas among various paths through which the first hole current HC1 may flow from the first tap group TA1 and TA4 to the voltage stabilization areas VS.

The STI area STI may include a trench structure formed through the STI process, and the dielectric material gap-filling the trench structure may cause a dangling bond on the surface of the trench structure, the dangling bond resulting in a dark current. When the well bunker area is connected as a whole without the bunker disconnection area, the first hole current HC1 may flow through various paths from the first tap group TA1 and TA4 to the voltage stabilization areas VS. In this case, since the first hole current HC1 comes into contact with the STI area STI, which causes a dangling bond, across a larger area, the influence of a dark current on the first hole current HC1 may be relatively increased to generate much noise.

When the first hole current HC1 intensively flows through a path including the bunker disconnection areas as in the present embodiment, the first hole current HC1 comes into contact with the STI area STI, which causes a dangling bond, across a smaller area. Therefore, the influence of a dark current on the first hole current HC1 may be relatively decreased to minimize noise.

As illustrated in FIG. 8, the first hole current HC1 may flow through a bending path, not a straight path, between the first tap group TA1 and TA4 and the voltage stabilization area VS. The first hole current HC1 may flow from the location at which the electrical potential is high to the location at which the electrical potential is low. As the bunker disconnection areas are disposed closer to the first or second straight line described with reference to FIG. 2 than the first to fourth bending points of the first to fourth well bunker areas WBA1 to WBA4, the electrical potential may be sequentially changed along the bending path such as the path of the first hole current HC1. When the electrical potential is changed along the bending path such as the path of the first hole current HC1, the first hole current HC1 may be suppressed as much as possible, which makes it possible to minimize unnecessary power consumption. Furthermore, an electric field may be formed across a larger area than when the electrical potential is changed along a straight path, which makes it possible to efficiently collect photocharges. Thus, the demodulation contrast may be improved.

Figure 9:
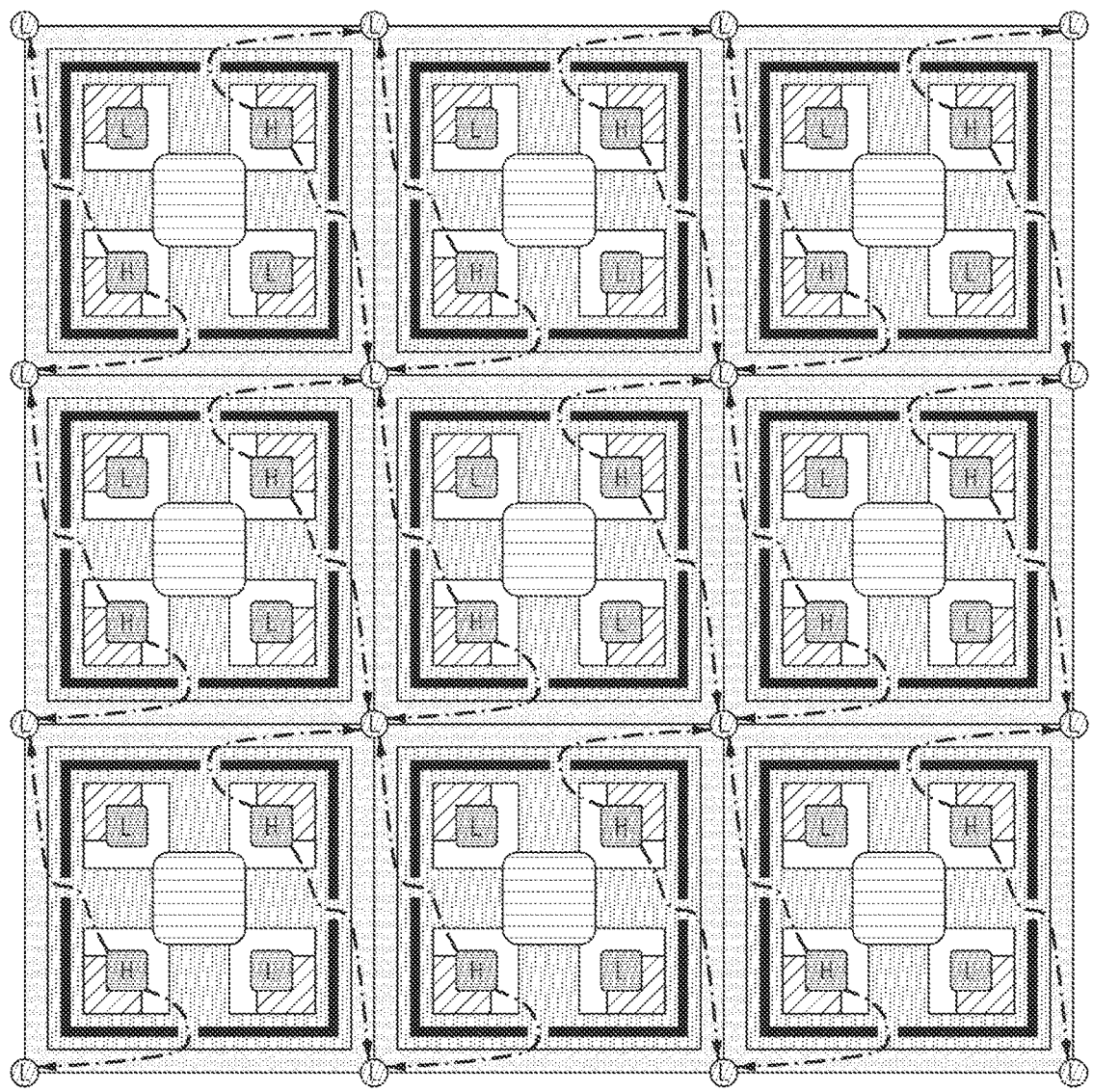
FIG. 9 is a diagram illustrating hole currents flowing through pixels arranged in a matrix in the second period.
Figure 9:
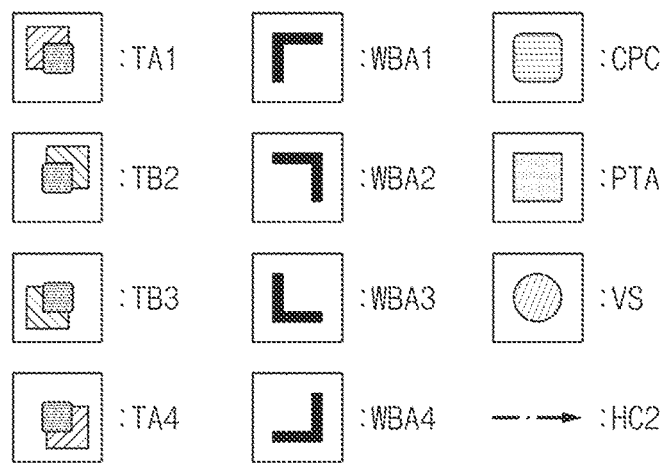

FIG. 9 is a diagram illustrating hole currents flowing through pixels arranged in a matrix in the second period.

FIG. 9 illustrates hole currents flowing between the activated second tap group and the voltage stabilization areas VS in the second period in which the first and fourth taps TA1 and TA4 belonging to the first tap group are inactivated and the second and third taps TB2 and TB3 belonging to the second tap group are activated, for the pixels illustrated in FIG. 8.

Second hole currents HC2 may flow from the second tap group TB2 and TB3 to the voltage stabilization areas VS.

Specifically, the second tap TB2 may generate the second hole current HC2 toward the second and fourth voltage stabilization areas adjacent to the second tap TB2. At this time, the second hole current HC2 flowing between the second tap TB2 and the second voltage stabilization area may be outputted from the second tap TB2, and flow along a bending path toward the second bunker disconnection area and pass through the second bunker disconnection area. Then, the second hole current HC2 may flow along a bending path toward the second voltage stabilization area and be inputted to the second voltage stabilization area. Similarly, the second hole current HC2 flowing between the second tap TB2 and the fourth voltage stabilization area may be outputted from the second tap TB2, and flow along a bending path toward the third bunker disconnection area and pass through the third bunker disconnection area. Then, the second hole current HC2 may flow along a bending path toward the fourth voltage stabilization area and be inputted to the fourth voltage stabilization area. This is because the resistance of the bunker disconnection area is considerably lower than the resistance of the well bunker area, and the second hole current HC2 may substantially flow only through the bunker disconnection area. Furthermore, as the second bunker disconnection area is disposed closer to the second voltage stabilization area than the first voltage stabilization area and the third bunker disconnection area is disposed closer to the fourth voltage stabilization area than the second voltage stabilization area, the above-described flow of the second hole current HC2 may be induced.

The third tap TB3 may generate the second hole current HC2 toward the first and third voltage stabilization areas adjacent to the third tap TB3. At this time, the second hole current HC2 flowing between the third tap TB3 and the first voltage stabilization area may be outputted from the third tap TB3, and flow along a bending path toward the first bunker disconnection area and pass through the first bunker disconnection area. Then, the second hole current HC2 may flow along a bending path toward the first voltage stabilization area and be inputted to the first voltage stabilization area. Similarly, the second hole current HC2 flowing between the third tap TB3 and the third voltage stabilization area may be outputted from the third tap TB3, and flow along a bending path toward the fourth bunker disconnection area and pass through the fourth bunker disconnection area. Then, the second hole current HC2 may flow along a bending path toward the third voltage stabilization area and be inputted to the third voltage stabilization area. This is because the resistance of the bunker disconnection area is considerably lower than the resistance of the well bunker area, and the second hole current HC2 may substantially flow only through the bunker disconnection area. Furthermore, as the first bunker disconnection area is disposed closer to the first voltage stabilization area than the third voltage stabilization area and the fourth bunker disconnection area is disposed closer to the third voltage stabilization area than the fourth voltage stabilization area, the above-described flow of the second hole current HC2 may be induced.

The second hole current HC2 intensively flows through a path including the bunker disconnection areas among various paths through which the second hole current HC2 may flow from the second tap group TB2 and TB3 to the voltage stabilization areas VS When the well bunker area is connected as a whole without the bunker disconnection area, the second hole current HC2 may flow through various paths from the second tap group TB2 and TB3 to the voltage stabilization areas VS. In this case, since the second hole current HC2 comes into contact with the STI area STI, which causes a dangling bond, across a larger area, the influence of a dark current on the second hole current HC2 may be increased to generate much noise.

However, when the second hole current HC2 intensively flows through a path including the bunker disconnection areas as in the present embodiment, the second hole current HC2 comes into contact with the STI area STI, which causes a dangling bond, across a smaller area. Therefore, the influence of a dark current on the second hole current HC2 may be decreased to minimize noise.

As illustrated in FIG. 9, the second hole current HC2 may flow through a bending path, not a straight path, between the second tap group TB2 and TB3 and the voltage stabilization area VS. The second hole current HC2 flows from the location at which the electrical potential is high to the location at which the electrical potential is low. As the bunker disconnection areas are disposed closer to the first or second straight line described with reference to FIG. 2 than the first to fourth bending points of the first to fourth well bunker areas WBA1 to WBA4, the electrical potential may be sequentially changed along the bending path such as the path of the second hole current HC2. When the electrical potential is changed along the bending path such as the path of the second hole current HC2, the second hole current HC2 may be suppressed as much as possible, which makes it possible to minimize power consumption. Furthermore, an electric field may be formed across a larger area than when the electrical potential is changed along a straight path, which makes it possible to efficiently collect photocharges. Thus, the demodulation contrast may be improved.

While various embodiments have been described above, it will be understood to those skilled in the art that the embodiments described are examples only. Variations and enhancements of the disclosed embodiments and other embodiments of the disclosed technology may be made based on what is disclosed in this patent document.

What is claimed is:

1. An image sensing device comprising:
   a substrate having a first surface on which light is incident and a second surface facing the first surface;
   a plurality of detection structures, each comprising a control node configured to exhibit a conductivity type and generate a potential gradient in the substrate, and a detection node configured to capture photocharge which is generated in response to incident light and migrates in response to the potential gradient;
   a first well area disposed to abut the control nodes of the plurality of detection structures and containing an impurity with a different conductivity type from the conductivity type of the control nodes; and
   a second well area spaced apart from the control node by a predetermined distance and overlapping with the control node, the second well area including an impurity with a same conductivity type as the conductivity type of the control nodes,
   wherein the first well area comprises a well opening extended toward the first surface between the second well areas adjacent to each other.

2. The image sensing device of claim 1, wherein the first well area comprises a depletion area formed by a PN junction with each of the control nodes,
   wherein a potential of the depletion area is controlled by a voltage applied to the control node abutting the depletion area.

3. The image sensing device of claim 1, further comprising:
   a pixel transistor area comprising pixel transistors, each configured to convert the captured photocharge into a pixel signal;
   an STI (Shallow Trench Isolation) area configured to isolate the pixel transistor area from each of the detection structures; and
   a well bunker area disposed in the STI area to isolate the STI area from another STI area.

4. The image sensing device of claim 3, wherein the STI area comprises a trench having a predetermined depth from the second surface,
   wherein the trench is not disposed in the well bunker area.

5. The image sensing device of claim 3, wherein the pixel transistor area comprises a transistor well area corresponding to bodies of the pixel transistors,
   wherein at least a part of the transistor well area is disposed in the well bunker area.

6. The image sensing device of claim 5, wherein at least a part of a boundary between the transistor well area and the substrate is disposed in the well bunker area.

7. The image sensing device of claim 1, wherein the control node comprises an impurity with a first conductive type, and the detection node comprises an impurity with a second conductive type different from the first conductive type.

8. The image sensing device of claim 7, wherein the first well area comprises the impurity with the second conductive type.

9. The image sensing device of claim 7, further comprising
   a third well area spaced apart from the control node by a predetermined distance and overlapping with the detection node, the third well area including the impurity with the first conductive type,
   wherein the second well area includes the impurity with the first conductive type.

10. The image sensing device of claim 3, wherein the detection structures comprise a first tap, a second tap, a third tap and a fourth tap that are respectively disposed at a left top, right top, left bottom and right bottom of a pixel.

11. The image sensing device of claim 10, further comprising a first voltage stabilization area, a second voltage stabilization area, a third voltage stabilization area and a fourth voltage stabilization area that are respectively disposed at a first vertex, a second vertex, a third vertex and a fourth vertex of the pixel and configured to supply body voltages of the pixel transistors.

12. The image sensing device of claim 11, wherein the well bunker areas comprise a first well bunker area, a second well bunker area, a third well bunker area and a fourth well bunker area that are disposed between the first to fourth voltage stabilization areas and the first to fourth taps,
   wherein each of the first to fourth well bunker areas has an L-shape.

13. The image sensing device of claim 12, wherein the STI area comprises a first bunker disconnection area, a second bunker disconnection area, a third bunker disconnection area and a fourth bunker disconnection area that are disposed between the well bunker areas adjacent to each other among the first to fourth well bunker areas, wherein each of the first to fourth bunker disconnection areas comprises a trench having a predetermined depth from the second surface.

14. The image sensing device of claim 13, wherein the first bunker disconnection area is disposed closer to the first voltage stabilization area than the third voltage stabilization area, the second bunker disconnection area is disposed closer to the second voltage stabilization area than the first voltage stabilization area, the third bunker disconnection area is disposed closer to the fourth voltage stabilization area than the second voltage stabilization area, and the fourth bunker disconnection area is disposed closer to the third voltage stabilization area than the fourth voltage stabilization area.

15. The image sensing device of claim 12, wherein the first to fourth well bunker areas are rotationally symmetrical with each other around a center of the pixel.

16. An image sensing device comprising:

detection structures disposed in a pixel and configured to generate a potential gradient in a substrate and capture photocharges which are generated by incident light and migrated by the potential gradient;

a first well area disposed to abut on the detection structures and including an impurity with a first conductivity type;

a pixel transistor area disposed along an edge of the pixel and comprising pixel transistors, the pixel transistors configured to convert the captured photocharge into a pixel signal;

an STI area comprising a trench disposed between the pixel transistor area and each of the detection structures; and one or more well bunker areas disposed in the STI area without having the trench.

17. The image sensing device of claim 16, wherein each of the detection structures includes a control node configured to receive a control signal and a detection node disposed at one side of the control node and configured to capture signal carries that migrate along the potential gradient.

18. The image sensing device of claim 17, wherein control nodes of the detection structures have an impurity with a second conductivity type different from the first conductivity type.

19. The image sensing device of claim 17, wherein the first well area comprises a depletion area through which the photocharges move toward detection nodes of the detection structures.

* * * * *